(12) United States Patent
Jun et al.

(10) Patent No.: US 12,456,702 B2
(45) Date of Patent: Oct. 28, 2025

(54) DEVICE, METHOD AND SYSTEM TO MITIGATE STRESS ON HYBRID BONDS IN A MULTI-TIER ARRANGEMENT OF CHIPLETS

(71) Applicant: Intel Corporation, Santa Clara, CA (US)

(72) Inventors: Kimin Jun, Portland, OR (US); Feras Eid, Chandler, AZ (US); Adel Elsherbini, Tempe, AZ (US); Aleksandar Aleksov, Chandler, AZ (US); Shawna Liff, Scottsdale, AZ (US); Johanna Swan, Scottsdale, AZ (US); Julien Sebot, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 870 days.

(21) Appl. No.: 17/359,380

(22) Filed: Jun. 25, 2021

(65) Prior Publication Data
US 2022/0415837 A1    Dec. 29, 2022

(51) Int. Cl.
*H01L 23/00* (2006.01)
*H01L 21/56* (2006.01)
*H01L 23/31* (2006.01)
*H01L 25/00* (2006.01)
*H01L 25/065* (2023.01)

(52) U.S. Cl.
CPC .......... *H01L 24/08* (2013.01); *H01L 21/565* (2013.01); *H01L 23/3128* (2013.01); *H01L 23/562* (2013.01); *H01L 24/80* (2013.01); *H01L 25/0652* (2013.01); *H01L 25/50* (2013.01); *H01L 2224/08145* (2013.01); *H01L 2224/80895* (2013.01); *H01L 2224/80896* (2013.01); *H01L 2225/06586* (2013.01); *H01L 2924/351* (2013.01)

(58) Field of Classification Search
None
See application file for complete search history.

(56) References Cited

U.S. PATENT DOCUMENTS

| 2017/0062383 A1* | 3/2017 | Yee | H01L 24/09 |
| 2021/0035859 A1* | 2/2021 | Mehta | H01L 23/3135 |

FOREIGN PATENT DOCUMENTS

| DE | 102020104147 A1 * | 10/2020 | H01L 21/50 |
| WO | WO-2021081943 A1 * | 5/2021 | |

* cited by examiner

*Primary Examiner* — Telly D Green
(74) *Attorney, Agent, or Firm* — Essential Patents Group, LLP

(57) ABSTRACT

Techniques and mechanisms for mitigating stress on hybrid bonded interfaces in a multi-tier arrangement of integrated circuit (IC) dies. In an embodiment, first dies are bonded at a host die each via a respective one of first hybrid bond interfaces, wherein a second one or more dies are coupled to the host die each via a respective one of the first dies, and via a respective second hybrid bond interface. Stress at one of the hybrid bond interfaces is mitigated by properties of a first dielectric layer that extends to that hybrid bond interface. In another embodiment, stress at a given one of the hybrid bond interfaces is mitigated by properties of a dummy chip—or alternatively, properties of a patterned encapsulation structure—which is formed on the given hybrid bond interface.

9 Claims, 19 Drawing Sheets

200

210
For each of a wafer, one of a first die or a second die, and a third die, form respective dielectric layers comprising a first layer of a first dielectric, wherein first conductive interconnect structures extend in the first layer, wherein a composition of the first dielectric is different than that of a second dielectric of a second layer of the respective dielectric layers 212
Directly bond the first die to the wafer via a respective one of first hybrid bond interfaces 214
Directly bond the second die to the wafer via a respective one of the first hybrid bond interfaces, wherein the respective first layer of the one of the first die or the second die extends to one of the first hybrid bond interfaces 216
Couple a third die to the wafer via one of the first die or the second die, and via a second hybrid bond interface, wherein the respective first layer of the third die extends to the second hybrid bond interface

FIG. 2

DEVICE, METHOD AND SYSTEM TO MITIGATE STRESS ON HYBRID BONDS IN A MULTI-TIER ARRANGEMENT OF CHIPLETS

BACKGROUND

1. Technical Field

This disclosure generally relates to packaging semiconductor devices and more particularly, but not exclusively, to structures which mitigate stress in a hybrid bond.

2. Background Art

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like. Mobile products, such as cell phones, for example, often have microelectronic packages with small form factors which can pose many thermal challenges. Due to increasingly shrinking dimensions of conductive traces, and the continually increasing complexity and power density of logic within devices, pitch scaling between conductive interconnect structures, such as between die interconnect structures, for example, can become a challenge during manufacturing processes, which frequently require thermal processing steps.

Hybrid bonding is an approach where a first wafer or chip surface having both metallized regions (e.g., copper) and dielectric regions is bonded with second wafer or chip surface having both metallized and dielectric regions that are matched to those of the first wafer or chip surface so that both metal-to-metal bonds and dielectric-to-dielectric bonds are formed. Such bonding allows for the dimensions of die packaging electrical connections to be shrunk well below prior limits, thereby increasing the interconnect densities and/or increasing the number of addressable signals for a composite IC chip of a given size (footprint).

However, as successive generations of interconnect technologies continue to scale in size and pitch, such technologies tend to become increasingly sensitive to the effects of mechanical (or other) stresses, both during and after fabrication and assembly. Thus, there is expected to be an increasing premium placed on improvements to such interconnect technologies.

BRIEF DESCRIPTION OF THE DRAWINGS

The various embodiments of the present invention are illustrated by way of example, and not by way of limitation, in the figures of the accompanying drawings and in which:

FIG. 2 shows a flow diagram illustrating features of a method to provide structures of a circuit device according to an embodiment.

DETAILED DESCRIPTION

Figure 1:
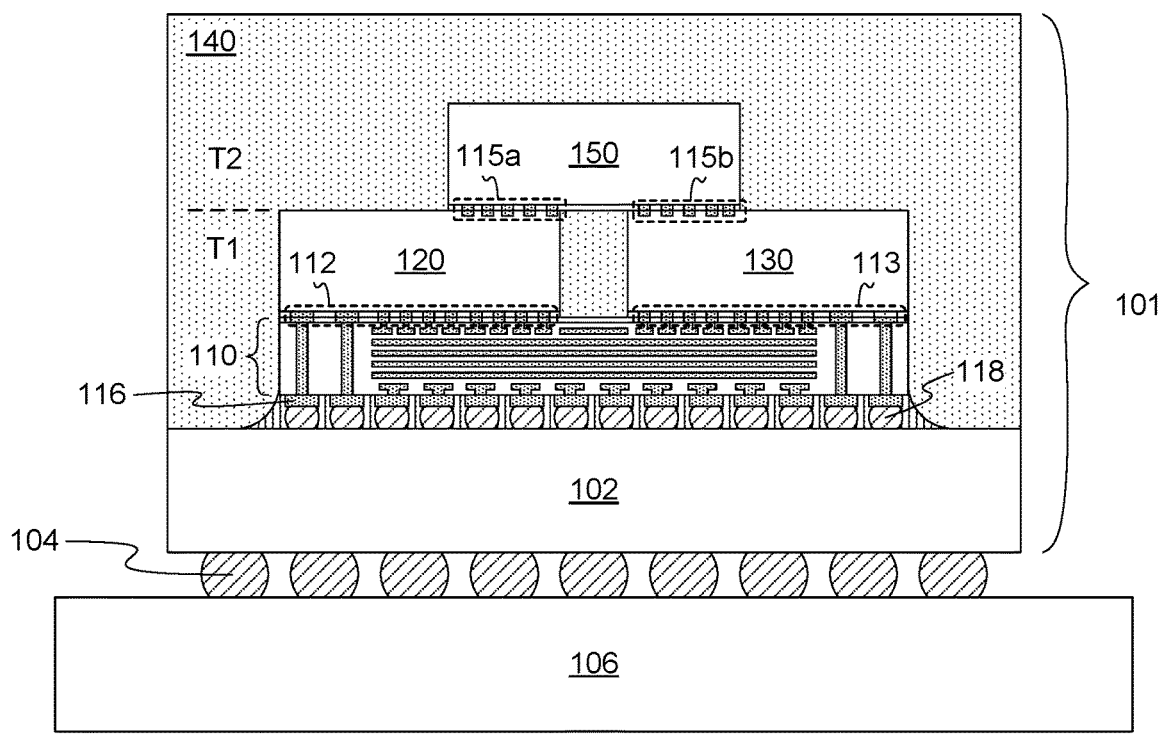
FIG. 1 shows a cross-sectional side view diagram illustrating features of a system comprising a hybrid bond between a substrate and one or more integrated circuit (IC) chiplets according to an embodiment.

Embodiments discussed herein variously provide techniques and mechanisms for mitigating stress on hybrid bonded interfaces in a multi-tier arrangement of integrated circuit (IC) chiplets. In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, Internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a substrate and one or more IC chips bonded thereto.

Various implementations of the embodiments described herein are formed or carried out on a substrate, such as that of a semiconductor wafer (or, for example, a package substrate). In some embodiments, a semiconductor substrate comprises any suitable type of substrate capable of providing electrical communications between an electrical component, such as an integrated circuit (IC) die, and one or more other electrical components including (for example) another IC die in a same level on a side of the substrate, another IC die in a different level on the side of the substrate, another IC die on an opposite side of the substrate, and/or the like.

In some embodiments, a substrate also provides structural support for a device, such as an IC die. By way of example, in some embodiments, a substrate comprises a multilayer substrate—which is to provide functionality of a silicon interposer, for example—including alternating layers of a dielectric material and metal and, in some embodiments, includes through via structures. Other types of substrates and substrate materials also find use with various disclosed embodiments (e.g., ceramics, sapphire, glass, etc.).

A die includes a front-side and an opposing back-side, and is an integrated circuit die and/or an integrated circuit device, in some embodiments. In some embodiments, one or both of the front-side or the back-side of a die is referred to as the "active surface" of the die. In an embodiment, a number of interconnects extend from a die's front-side and/or back-side to an underlying device and/or an overlaying device respectively—e.g., where such interconnects electrically couple the die and one or more device (including, for example, a substrate and one or more other dies). Interconnects/traces comprise any type of structure and materials capable of providing electrical communication between a die and a substrate (or another die). In some embodiments, interconnects comprise an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Described herein are embodiments of microelectronic package structures to mitigate stress on a hybrid bonding interface. In an embodiment, a substrate comprises a first dielectric layer, and one or more first interconnect structures disposed within the first dielectric layer. An IC die, to be bonded to the substrate via the first dielectric layer, comprises a second dielectric layer, and one or more second interconnect structures disposed within the second dielectric layer. The one or more first interconnect structures are directly bonded to the one or more second interconnect structures, and respective dielectrics of the first and second dielectric layers are directly bonded to each other—e.g., covalently after subsequent temperature processing of the microelectronic package structure. Metal-to metal-bonding of the conductive interconnect structures (which takes place after the dielectric covalent bonding is created) is accomplished without the use of solder or underfill materials. Such hybrid bonding, in some embodiments, provides a strong bond at relatively low temperatures as compared to other types of permanent bonding. Additionally or alternatively, pitch scaling between die interconnect structures is enabled for pitches well below 50 microns, in some embodiments.

Chip assembly poses particular challenges with respect to the warpage of various bonded structures—e.g., as compared to the bonding of monolithic wafers. For example, assembly of one or more tiers of dies (e.g., chiplets) on a wafer, or other substrate, is usually followed by the dies being encapsulated in another material, such as mold compound. Different physical properties of the various materials—e.g., including a difference between a coefficient of thermal expansion (CTE) of a wafer material and a CTE of a mold compound—contributes to warpage at a bonding interface. Such warpage tends to be compounded with as successive layers of chips are bonded to the same substrate.

Hybrid bonding enables tight interconnect pitches for vertical stacking of multi-wafers and/multi-die systems. However, as successive generations of fabrication techniques enable the scaling of bond pad pitches to the sub-10 micron (µm) domain, the accuracy of lithography, chip assembly and other processes are significantly affected by substrate warpage.

Here, the term "back end of the line (BEOL) generally refers to post-device fabrication operations on a semiconductor wafer. After formation of the active and passive devices within a circuit layer on the semiconductor wafer in a front-end of the fabrication line (e.g., front-end-of-the line or FEOL), a series of operations where metal features are formed (metallization) over the semiconductor devices comprise the BEOL portion of the fabrication line.

Some embodiments mitigate stresses on hybrid bonds in a multi-tier configuration of dies—e.g., wherein smaller dies are commonly referred to as "chiplets or "tiles." Certain features of various embodiments are described herein with reference to a multi-tier configuration of chiplets. However, it is to be appreciated that such description can be extended to additionally or alternatively apply to stress mitigation for hybrid bonds between chiplets (or tiles) and/or any of various other dies in multi-tier configuration.

Here, the term "chiplet" generally refers to a small, thin die embedded in or on the BEOL metallization of a larger host die. In the described embodiments, chiplets (or other suitable dies) share metallization levels with the host die, and may share dielectric materials. Chiplets may carry specialized integrated circuits, for example, clocking circuits, active repeater banks for long-distance on-die interconnects, etc.

Some embodiment variously provide structures to mitigate stresses—e.g., comprising a tensile stress and/or a compressive stress—at different respective levels in a multi-tier configuration of chiplets which are variously coupled to a wafer, a host die or other such underlying structure. For example, one tier of the multi-tier configuration comprises first chiplets which are each bonded directly to said underlying structure. In one such embodiment, another tier comprises one or more other chiplets which are each coupled to the underlying structure via a respective one of the first chiplets, and (for example) via a respective hybrid bond.

Certain features of various embodiments are described herein with reference to a given device—such as a chiplet—being coupled, directly or indirectly, to another device (e.g., to a wafer, a host die, or another chiplet) via a hybrid bond interface. In this context, "hybrid bond interface" refers herein to a region where respective interconnect structures of two device are directly bonded together—e.g., independent of any solder or other such intermediary material being disposed between said interconnect structures. With respect to a given one such device, "interface structures" (unless otherwise indicated) refers herein to structures of the device which are bonded at, or which are to otherwise extend to, a hybrid bond interface to be formed with another device.

For example, interface structures of a given device comprise one or more conductive interconnect structures which each provide a respective contact to be subjected to hybrid bonding to a corresponding conductive interconnect structure of another device. In an embodiment, one side of the device is formed at least in part by a layer of a dielectric material (or, for brevity, a "dielectric layer")—e.g., wherein the one or more conductive interconnect structures each extend through said layer.

Various embodiments provide structures (referred to herein as "stress mitigation structures") of different types and/or at different levels in a multi-tier arrangement of chiplets. In one such embodiment, stress mitigation structures comprise a dielectric layer of a device—e.g., wherein the dielectric layer extends to a hybrid bond interface, and has a substantially different material composition than that of another dielectric layer (for example, and adjoining dielectric layer) of the same device. Additionally or alternatively, stress mitigation structures comprise a patterned encapsulation structure comprising a first body of a first material, and a second body of a second material—e.g., bodies comprising different respective mold compounds.

Additionally or alternatively, stress mitigation structures comprise a dummy chiplet structure (or alternatively, another chiplet which has a substrate of a substantially different composition) which is bonded with one or more chiplets of the multi-tier arrangement. In providing stress mitigation structures each in a respective hybrid bond interface, or between respective levels of different hybrid bond interfaces, some embodiments improve the size and/or variety of multi-tier chiplet arrangements which are available for use in packaged devices.

FIG. 1 shows features of a system 100 comprising a hybrid bond between a substrate and one or more IC chiplets according to an embodiment. System 100 illustrates one example of an embodiment which comprises a multi-tier configuration of multiple chiplets, and one or more structures, each in or on a respective hybrid bond interface, which mitigate stress on the respective hybrid bond interface.

As shown in FIG. 1, system 100 comprises a packaged device 101 and a host board 106—including a motherboard or any of a various other printed circuit boards—which is coupled thereto (for example, via the illustrative solder joints 104 shown). Packaged device 101 comprises a package substrate 102 and integrated circuitry disposed thereon, wherein the integrated circuitry comprises a host die (represented as the illustrative substrate 110 shown), and one or more chiplets which are variously coupled to the host die. Some or all of the chiplets are coupled to the host die each via a respective hybrid bond interface, wherein structures in or on the hybrid bond interface mitigate stress on the hybrid bond interface. Some embodiments are provided entirely with structures of packaged device 101—e.g., where such embodiments omit some or all of host board 106, solder joints 104, and package substrate 102.

In the example embodiment shown, packaged device 101 comprises chiplets 120, 130, 130, a substrate 110 (e.g., a host die), and a package substrate 102. For one embodiment, chiplets 120, 130 are coupled via respective hybrid bond interfaces 112, 113 which are formed by one or more hybrid bonding processes. Furthermore, chiplet 150 is coupled to chiplets 120, 130—e.g., via respective hybrid bond interfaces 115a, 115b— to form a multi-tier chiplet arrangement comprising a first tier T1 and a second tier T2 thereon. That is, according to some embodiments, chiplets 120, 130, 150 are disposed over substrate 110, while substrate 110 is disposed over package substrate 102. Note that, while one substrate 110, and chiplets 120, 130, 150 are illustrated in FIG. 1, it is to be appreciated that any number of host dies, and chiplets are combined/stacked with, disposed on/over, and coupled to package substrate 102, in various embodiments.

As described herein, a given hybrid bond interface—e.g., including one of hybrid bond interfaces 112, 113, 115a, 115b—is formed where first conductive contacts of a chiplet (for example), are directly bonded to second conductive contacts of another device, such as a host die or another chiplet. In one such embodiment, the chiplet and the device each comprise a respective first layer of a respective dielectric material which extends to, and between, interconnect structures at the hybrid bond interface. By way of illustration and not limitation, conductive contacts of a hybrid bond include pads of copper (Cu) or another suitable conductor.

Host board 106 illustrates any of a variety of structures—e.g., including, but not limited to, a package, a substrate, and/or a printed circuit board (PCB)— which provides structural support for packaged device 101 and conductive coupling with various ones of substrate 110, chiplet 120, and chiplet 130. For one embodiment, host board 106 is a PCB.

For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB comprises one or more dielectric layers, where each dielectric layer is a photosensitive dielectric layer. For one embodiment, the host board 106 comprises a plurality of conductive layers, which further comprise copper (or metallic) traces, lines, pads, vias, via pads, holes, and/or planes.

As shown in FIG. 1, substrate 110 is disposed over package substrate 102, where substrate 110 is conductively coupled to package substrate 102 with solder joints 118. By way of illustration and not limitation, substrate 110 comprises a plurality of redistribution layers (RDLs) comprised of traces with a line-and-space (L/S) ratio of approximately or less than 2/2 microns (μm), litho vias, zero-misalignment vias, and/or via pads with thicknesses of approximately or less than 18 μm. The substrate 110 comprises a silicon substrate having increased (or high) input/output (I/O) density and bandwidth for communication with chiplets 120, 130. In one embodiment, substrate 110 has a thickness of approximately 10 μm to 200 μm.

In one embodiment, substrate 110 comprises conductive contacts 116 and first conductive interconnects variously coupled thereto. The conductive contacts 116 are disposed on the bottom surface of substrate 110. In one example embodiment, conductive contacts 116 have a pitch of greater than approximately 80 μm. The conductive contacts 116 comprises a plurality of ball-grid array (BGA) pads, for example. Such first conductive interconnects of substrate 110 comprise vias, traces, lines, pads, or the like. For example, various ones of such first conductive interconnects are directly coupled each to a respective one of conductive contacts 116, where solder joints 118 conductively couple conductive contacts 116 of substrate 110 to the top surface of package substrate 102.

Various ones of the first conductive interconnects extend vertically from the bottom surface to the top surface of substrate 110—e.g., wherein one or more other conductive interconnects of substrate 110 are coupled between hybrid bond interfaces 112, 113. For example, the bottom surfaces of the first conductive interconnects of substrate 110 are directly coupled to conductive contacts 116, where the bottom surfaces of the first conductive interconnects are substantially coplanar to the bottom surface of substrate 110. Meanwhile, the top surfaces of such first conductive interconnects of substrate 110 are directly coupled to other conductive contacts at a top side of substrate 110—e.g., where the other conductive contacts are substantially coplanar to the top surface of substrate 110.

As shown in FIG. 1, chiplets 120, 130, 150 are be disposed over substrate 110. In some embodiments, first interface structures of substrate 110 comprise first conductive contacts which are variously disposed in, and extend through, a layer of a first dielectric material at a top side of substrate 110. Furthermore, second interface structures of chiplet 120 comprise second conductive contacts which are variously disposed in, and extend through, a layer of a second dielectric material at a bottom side of chiplet 120. Further still, third interface structures of chiplet 130 comprise third conductive contacts which are variously disposed in, and extend through, a layer of a third dielectric material at a bottom side of chiplet 130. For example, the first contacts are flush with a top surface of substrate 110—e.g., wherein the second contacts are flush with a bottom surface of chiplet 120, and wherein the third contacts are flush with a bottom surface of chiplet 130. In one such embodiment, a hybrid bond interface 112 is formed by a hybrid bonding of the second conductive contacts with first ones of the first conductive contacts. Additionally or alternatively, a hybrid bond interface 113 is formed by a hybrid bonding of the third conductive contacts with other ones of the first conductive contacts.

For one embodiment, chiplets 120, 130, 150 each have a respective thickness of approximately or greater than 200 µm. In another embodiment, chiplets 120, 130, 150 each have a respective thickness of approximately or less than 200 µm. For one embodiment, one or more of chiplets 120, 130, 150 comprise, but are not limited to, a respective one of a semiconductor die, an electronic device (e.g., a wireless device), an integrated circuit (IC), a central processing unit (CPU), a microprocessor, a platform controller hub (PCH), a memory (e.g., a high-bandwidth memory (HBM)), and/or a field-programmable gate array (FPGA). In various embodiments, chiplets 120, 130, 150 are formed from a material such as silicon and have circuitry thereon that is to be coupled to substrate 110.

In various embodiments, an encapsulation structure 140 is disposed over chiplets 120, 130, 150. For example, chiplets 120, 130 and substrate 110 are surrounded with encapsulation structure 140, which comprises one or more encapsulation materials. For one embodiment, encapsulation structure 140 is planarized as the top surface of encapsulation structure 140 is substantially coplanar to the top surfaces of chiplet 150, where encapsulation structure 140 is also disposed between chiplets 120, 130 (and/or between to chiplets of tier T2, in some embodiments).

Although some embodiments are not limited in this regard, encapsulation structure 140 is disposed over an underfill material (or an underfill layer). In one embodiment, the underfill material is disposed over package substrate 102, where the underfill material is disposed between the top surface of package substrate 102 and the bottom surfaces of encapsulation structure 140 and conductive contacts 116. The underfill material surrounds (or embeds) portions of encapsulation structure 140 and solder joints 118 that are disposed between encapsulation structure 140 and package substrate 102.

In additional embodiments, a thermal solution (or thermal device) is disposed over the top surfaces of chiplets 120, 130 and/or encapsulation structure 140, where the thermal solution comprises a heatsink, an integrated heat spreader (IHS), a manifold, a cold plate, or the like. Note that packaged device 101 includes fewer or additional packaging components based on the desired packaging design, in various embodiments.

As described herein, some embodiments variously provide structures to mitigate stresses on some or all of hybrid bond interfaces 112, 113, 115a, 115b (and/or stresses on one or more other hybrid bond interfaces of packaged device 101). In one such embodiment, for a given device (e.g., a given one of substrate 110, chiplet 120, chiplet 130, or chiplet 150), a dielectric layer of that device extends to a hybrid bond interface, wherein the dielectric layer has a substantially different material composition than that of another one or more dielectric layers in that same device. For example, the dielectric material of a layer which extends to one of hybrid bond interfaces 112, 113, 115a, 115b has a Young's modulus, a coefficient of thermal expansion (CTE) and/or other properties which facilitate an absorption of stress and/or a redistribution of stress in the multi-tier arrangement of chiplets 120, 130, 150.

Additionally or alternatively, encapsulation structure 140 comprises multiple bodies of different respective encapsulation materials—e.g., wherein two or more of the bodies each extend in a region between two chiplets, in a region under a chiplet, and/or the like. For example, a Young's modulus, a CTE, and/or other properties of a first body of a first encapsulation material—in combination with one or more properties of an adjoining body of a second encapsulation material—facilitates an absorption of stress and/or a redistribution of stress in the multi-tier arrangement of chiplets 120, 130, 150.

Additionally or alternatively, packaged device 101 comprises one of a dummy chiplet structure or another chiplet (having substantially different type of substrate material than that of other chiplets) which is bonded to the multi-tier configuration of chiplets on substrate 110. By way of illustration and not limitation, a dummy chiplet structure (not shown) is bonded to chiplets 120, 130, 150 or—for example—one of chiplets 120, 130, 150 is alternatively a dummy chiplet. For example, a Young's modulus, a CTE, and/or other properties of a dummy chiplet—in combination with one or more properties of an adjoining portion of encapsulation structure 140—facilitates an absorption of stress and/or a redistribution of stress in the multi-tier arrangement of chiplets 120, 130, 150. In another embodiment, a chiplet having a non-silicon substrate material—e.g., including any of various inorganic substrate materials with higher CTE than silicon (such as some glasses or ceramics), organic substrate materials, or the like—is additionally or alternatively coupled to a chiplets which, for example, each have a respective silicon substrate material.

FIG. 2 shows features of a method 200 to provide stress mitigation structures of a circuit device according to an embodiment. The method 200 illustrates one example of an embodiment wherein stress on hybrid bond interfaces is variously mitigated with respective dielectric materials at said hybrid bond interfaces. Operations such as those of method 200 are performed, for example, to provide structures of system 100. To illustrate certain features of various embodiments, method 200 is described herein with reference to structures of a packaged device 300 shown in FIG. 3A, and to stages 350-357 of fabrication processing which are shown in FIGS. 3B-3I (respectively). However, in other embodiments, method 200 fabricates any of various other suitable devices which provide functionality as described herein.

Figure 3A:
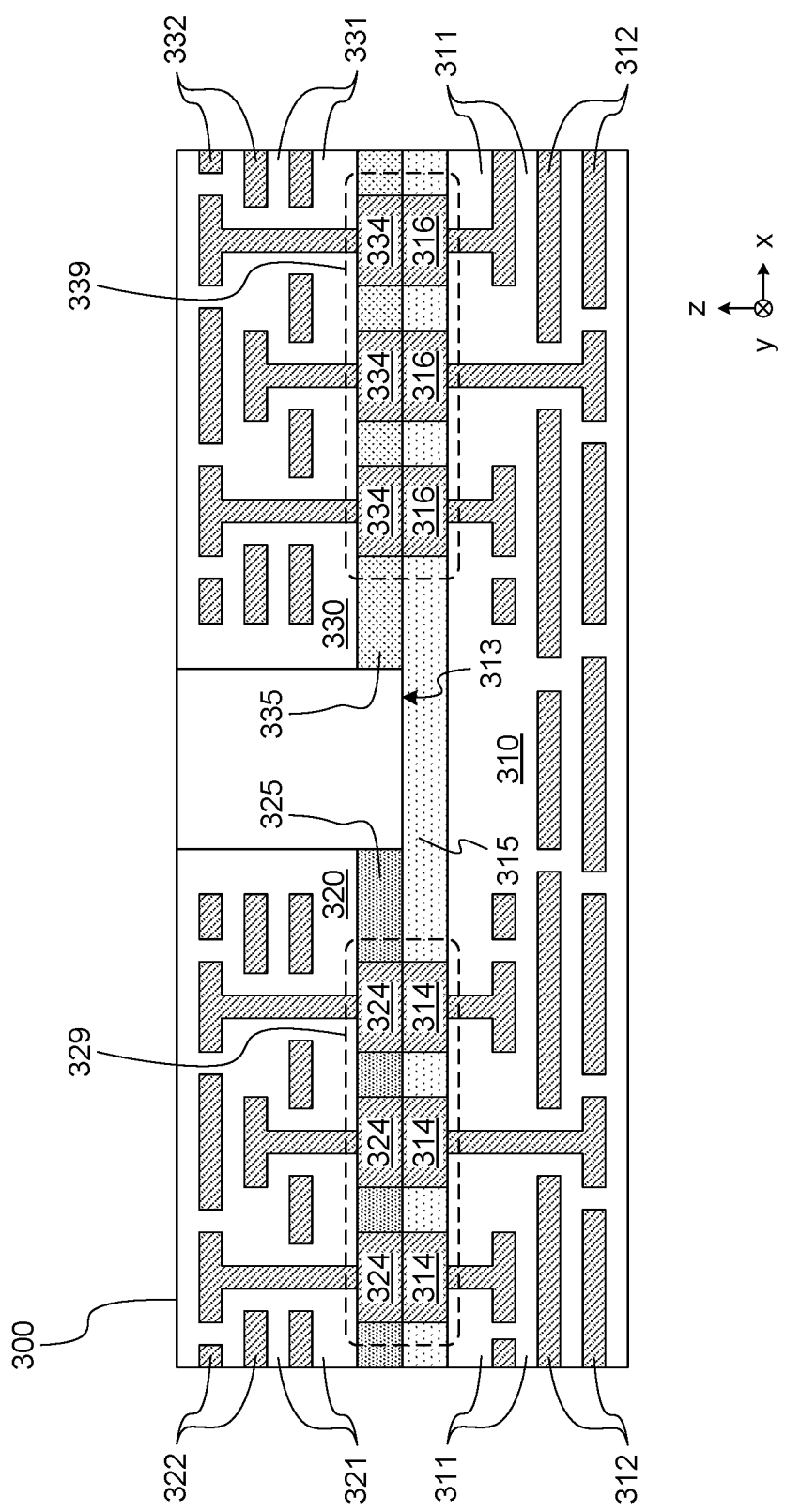
FIG. 3A shows a cross-sectional side view diagram illustrating features of a packaged device comprising structures to mitigate stress according to an embodiment.

Referring now to FIG. 3A, a packaged device 300 comprises structures to mitigate stresses at hybrid bond interfaces according to an embodiment. Device 300 illustrates one example of an embodiment wherein respective first dielectric layers of two devices extend to adjoin each other at the hybrid bond interface, and wherein, for a given one (or for each) of the two devices, the respective first dielectric layer of the given device has a material composition which is substantially different than that of a respective second dielectric layer of that given device.

As shown in FIG. 3A, device 300 comprises a substrate 310 (e.g., that of a wafer, or a host die) and one or more chiplets—such as the illustrative chiplets 320, 330 shown—which are bonded each at a surface 313 of substrate 310. By way of illustration and not limitation, first interface structures of substrate 310 comprises conductive contacts 314 and conductive contacts 316 which are variously disposed in, and extend through, a dielectric layer 315 which forms at least in part a top surface 313 of substrate 310. Furthermore, second interface structures of chiplet 320 comprises conductive contacts 324 which are variously disposed in, and extend through, a dielectric layer 325 which forms at least in part a bottom side of chiplet 320. Further still, third interface structures of chiplet 330 comprises conductive contacts 334 which are variously disposed in, and extend through, a dielectric layer 335 which forms at least in part a bottom side of chiplet 330. For example, conductive contacts 314 and conductive contacts 316 are flush with surface 313—e.g., wherein conductive contacts 324 are flush with a bottom surface of chiplet 320, and wherein conductive contacts 334 are flush with a bottom surface of chiplet 330.

In one such embodiment, a hybrid bond interface 329 is formed by a hybrid bonding of the conductive contacts 324 each with a respective one of conductive contacts 314. Additionally or alternatively, another hybrid bond interface 339 is formed by a hybrid bonding of conductive contacts 334 each with a respective one of conductive contacts 316. In one such embodiment, substrate 310 corresponds functionally to substrate 110, and chiplets 320, 330 correspond functionally to chiplets 120, 130—e.g., wherein hybrid bond interfaces 329, 339 provide functionality of hybrid bond interfaces 112, 113 (respectively).

In the example embodiment shown, substrate 310 further comprises dielectric layers 311 and metallization layers 312 which variously extend therein—e.g., wherein metallization layers 312 variously provide electrical coupling with conductive contacts 314 and conductive contacts 316. In various embodiments, metallization layers 312 facilitate coupling between one or more of conductive contacts 314, 316 and other contacts which are at an opposite side (not shown) of substrate 310. Additionally or alternatively, metallization layers 312 facilitate coupling between one or more of conductive contacts 314 and one or more of conductive contacts 316. Additionally or alternatively, metallization layers 312 facilitate coupling between one or more of conductive contacts 314, 316 and a device layer (not shown) comprising passive circuit elements and/or active circuit elements of substrate 310.

For some embodiments, chiplet 320 further comprises dielectric layers 321 and metallization layers 322 which variously extend therein—e.g., wherein metallization layers 322 provide electrical coupling with conductive contacts 324. In various embodiments, metallization layers 322 facilitate coupling between one or more of conductive contacts 324 and other contacts which are at an opposite side (not shown) of chiplet 320. Additionally or alternatively, metallization layers 322 facilitate coupling between one or more of conductive contacts 324 and a device layer (not shown) comprising passive circuit elements and/or active circuit elements of chiplet 320.

For some embodiments, chiplet 330 further comprises dielectric layers 331 and metallization layers 332 which variously extend therein—e.g., wherein metallization layers 332 provide electrical coupling with conductive contacts 334. In various embodiments, metallization layers 332 facilitate coupling between one or more of conductive contacts 334 and other contacts (not shown) which are at an opposite side of chiplet 330. Additionally or alternatively, metallization layers 332 facilitate coupling between one or more of conductive contacts 334 and a device layer (not shown) comprising passive circuit elements and/or active circuit elements of chiplet 330.

To facilitate stress mitigation in device 300, some embodiments variously provide for compositional diversity between the respective dielectric materials of a patterned layer which forms a side of a device (at least in part), and another patterned layer within that device. By way of illustration and not limitation, the material composition of a dielectric in one of dielectric layers 311 (for example, in each of dielectric layers 311) is different than that of the dielectric in dielectric layer 315. Additionally or alternatively, the material composition of a dielectric in one of (e.g., in each of) dielectric layers 321 is different than that of the dielectric in dielectric layer 325. Additionally or alternatively, the material composition of a dielectric in one of (e.g., in each of) dielectric layers 331 is different than that of the dielectric in dielectric layer 335.

Some embodiments variously mitigate stress by providing—at a side of a given device (e.g., one of substrate 310, chiplet 320 or chiplet 330)— a first dielectric of a first layer which extends a hybrid bond interface, where the first dielectric has a substantially different composition than that of a second dielectric in one or more second (interior) layers of that same given device. For example, the first layer comprises one of dielectric layers 315, 325, 335, in various embodiments.

In one such embodiment, the first dielectric comprises any of various suitable inorganic dielectric materials including silicon, nitrogen, carbon or oxygen, and combinations thereof, for example. By way of illustration and not limitation, the first dielectric comprises an inorganic dielectric film, such as one of silicon oxide (SiOx), silicon nitride (SiNx), silicon carbide (SiC), silicon oxy-carbide (SiOxCy), silicon oxy-nitride (SiON), silicon carbo-niride (SiCN), or silicon oxy-carbo-nitride (SiOCN).

Additionally or alternatively, the first dielectric is a composite dielectric which comprises a dielectric media, and filler particles of a different dielectric material that are disposed therein. In one such embodiment, the composite dielectric comprises inorganic filler particles that are disposed within an organic dielectric material—e.g., wherein the inorganic filler particles comprise silica materials, such as silica particles, low CTE dielectric fibers, dielectric particles, or platelets, silicon nitride, silicon dioxide, silicon carbide, silicon carbide nitride, aluminum oxide, diamond particles (such as CVD diamond particles), or combinations thereof.

In various embodiments, the first dielectric exhibits good stress absorption characteristics—e.g., wherein the first dielectric has a Young's modulus which (for example) is below 25 Gigapascals (GPa) and, in some embodiments, below 10 GPa. Examples of such dielectrics include, but are not limited to, any of various carbon doped oxide materials (such as an organosilicate glass), a porous SiOx material, or the like. By contrast, the second dielectric—of the one or more second (interior) layers of the device—corresponds to a greater Young's modulus (for example, where the second dielectric is silicon dioxide). By way of illustration and not limitation, a Young's modulus for the second dielectric is greater than 50 GPa, in various embodiments.

Structures such as those of device 300 are provided, for example, with method 200. For example, referring again to FIG. 2, method 200 comprises (at 210) forming, for each of multiple devices (i.e., including a wafer and at least one of a first die or a second die, and also including a third die), respective dielectric layers which comprise a first layer of a respective first dielectric and a second layer of a respective second dielectric which has a substantially different composition than that of the respective first dielectric. For each of the multiple devices, respective first conductive interconnect structures extend in the respective first layer. By way of illustration and not limitation, for a given device of the multiple devices, the respective first layer forms at least in part an exterior surface of the given device—e.g., wherein the respective second layer adjoins the respective first layer (or is otherwise a layer in an interior region of the given device). In an embodiment, respective second conductive interconnect structures extend in the respective second layer—e.g., wherein the second conductive interconnect structures are coupled to respective ones of the respective first conductive interconnect structures.

Figure 3B:
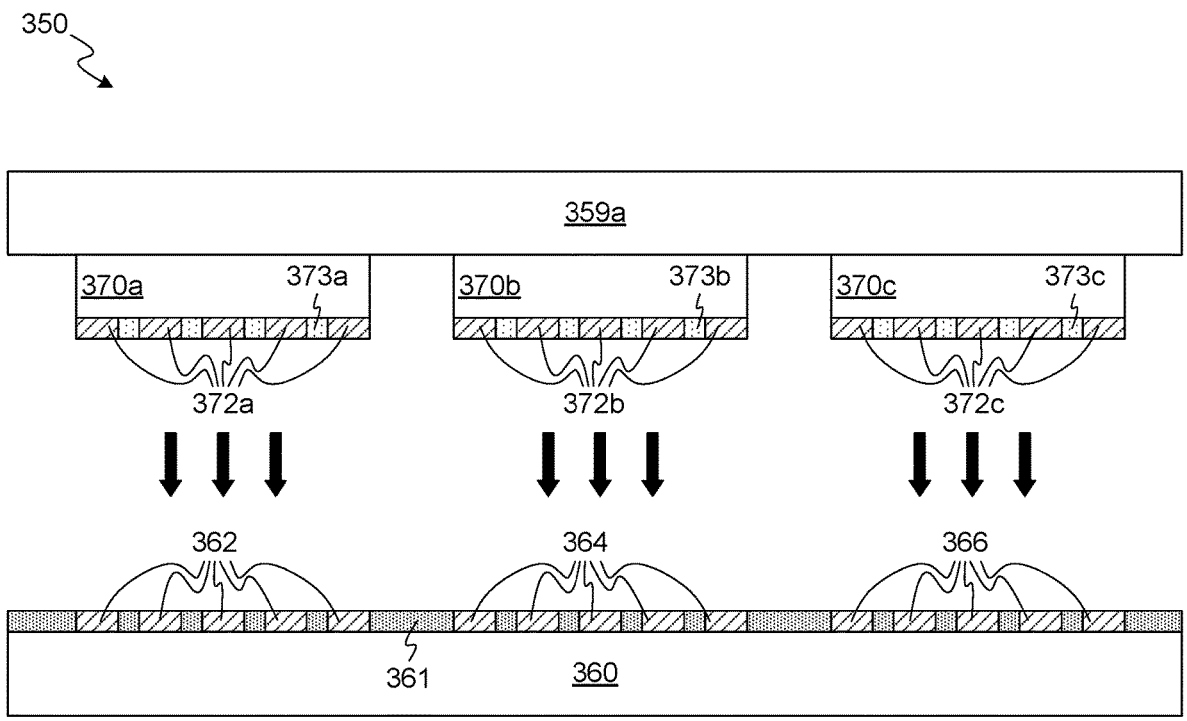
FIGS. 3B through 3I show cross-sectional side views each of a respective stage of processing to provide a packaged device according to a corresponding embodiment.
Figure 3C:
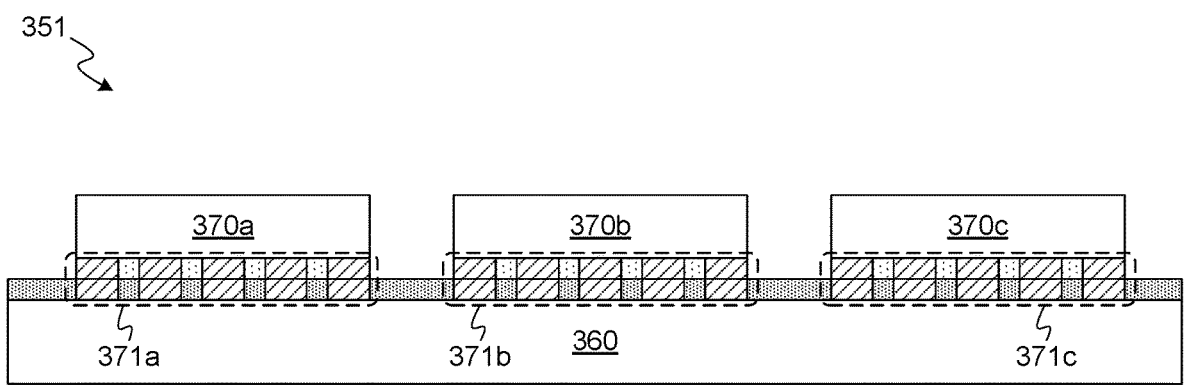
Figure 3D:
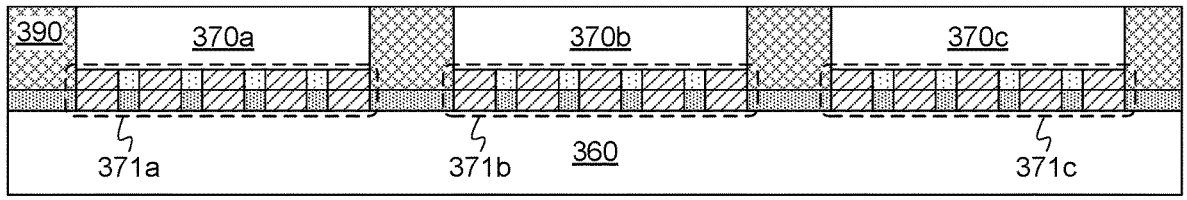
Figure 3E:
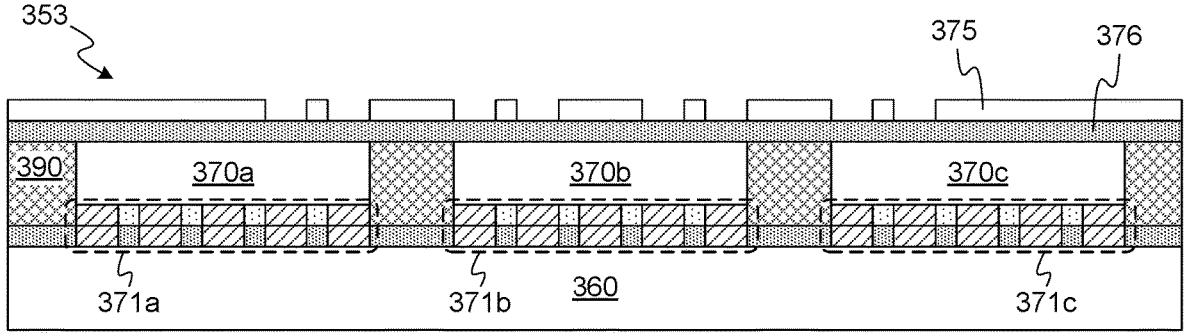
Figure 3F:
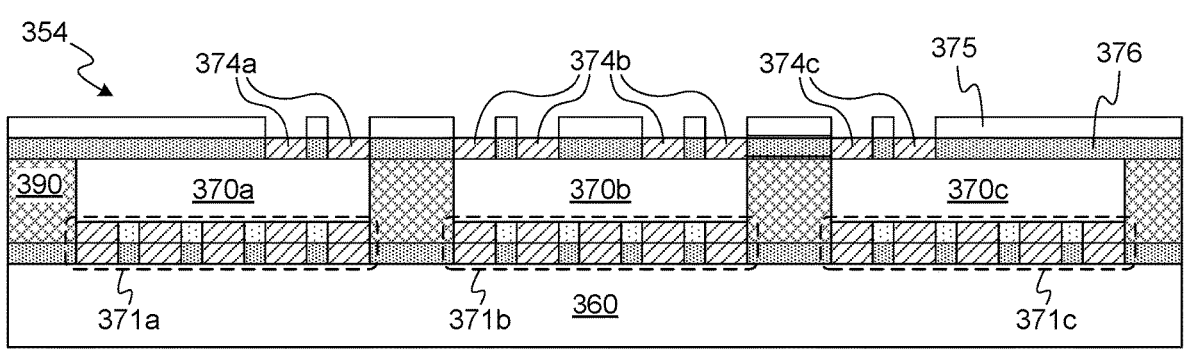
Figure 3G:
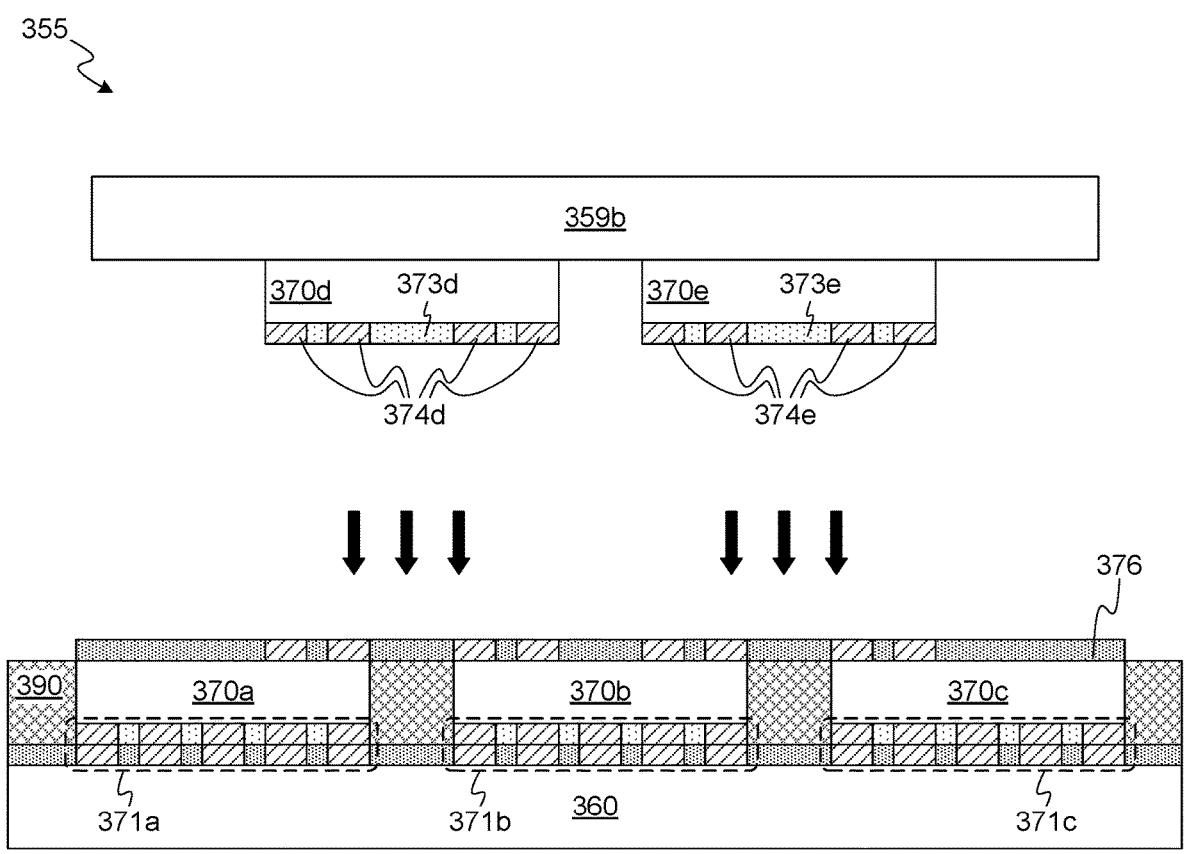

For example, referring now to the stage 350 shown in FIG. 3B, a top side of a semiconductor substrate 360 is formed at least in part by a dielectric layer 361 thereof, wherein interconnect structures 362, 364, and 366 of substrate 360 variously extend through dielectric layer 361. Conductive contacts, each formed by a respective one of interconnect structures 362, 364, and 366, variously provide interface structures at the top side of substrate 360. In various embodiments, a composition of dielectric layer 361 is substantially different than the composition of another dielectric layer (not shown) in substrate 360. In one such embodiment, substrate 360 corresponds functionally to substrate 310—e.g., wherein dielectric layer 361 provides functionality of dielectric layer 315, and wherein interconnect structures 362, 364, 366 variously provide functionality such as that of conductive contacts 314, 316.

In the example embodiment shown, multiple chiplets (e.g., including the illustrative chiplets 370a, 370b, 370c shown) are each coupled to a different respective region of a carrier wafer 359a. In one such embodiment, a bottom side of chiplet 370a is formed at least in part by a dielectric layer 373a, wherein interconnect structures 372a variously extend through dielectric layer 373a. Similarly, a bottom side of chiplet 370b is formed at least in part by a dielectric layer 373b, wherein interconnect structures 372b variously extend through dielectric layer 373b. Additionally or alternatively, a bottom side of chiplet 370c is formed at least in part by a dielectric layer 373c, wherein interconnect structures 372c variously extend through dielectric layer 373c To facilitate stress mitigation in a multi-tier chiplet configuration, a composition of dielectric layer 373a is substantially different than the composition of another dielectric layer (not shown) within chiplet 370a. Additionally or alternatively, a composition of dielectric layer 373b is substantially different than the composition of another dielectric layer (not shown) within chiplet 370b. Additionally or alternatively, a composition of dielectric layer 373c is substantially different than the composition of another dielectric layer (not shown) within chiplet 370c.

At stage 350, carrier wafer 359a is brought into a position over substrate 360—e.g., wherein interconnect structures 372a are aligned over interconnect structures 362, wherein interconnect structures 372b are aligned over interconnect structures 364, and wherein interconnect structures 372c are aligned over interconnect structures 366. Subsequently, carrier wafer 359a is moved, relative to substrate 360, to bring chiplet 370a, 370b, 370c into contact with dielectric layer 361. Hybrid bond processing is then performed to bond interconnect structures 372a, 372b, 372c each with a corresponding interconnect structure of substrate 360.

Referring again to FIG. 2, method 200 further comprises (at 212) directly bonding the first die to the wafer via a respective hybrid bond interface which is to be one of first hybrid bond interfaces at the wafer. Method 200 further comprises (at 214) directly bonding the second die to the wafer via a respective one of the first hybrid bond interfaces, wherein the respective first layer of the one of the first die or the second die extends to one of the first hybrid bond interfaces For example, referring now to the stage 351 shown in FIG. 3C, hybrid bonding results in the formation of a hybrid bond interface 371a wherein interconnect structures 362 are directly bonded each with a different respective one of interconnect structures 372a. Additionally or alternatively, a hybrid bond interface 371b is formed where interconnect structures 364 are directly bonded each with a different respective one of interconnect structures 372b. Additionally or alternatively, a hybrid bond interface 371c is formed where interconnect structures 366 are directly bonded each with a different respective one of interconnect structures 372c. In one such embodiment, hybrid bond processes further result in dielectric layer 373a being covalently (or otherwise) bonded with portions of dielectric layer 361 which extend between interconnect structures 362. Alternatively or in addition, dielectric layer 373b is similarly bonded with portions of dielectric layer 361 which extend between interconnect structures 364. Alternatively or in addition, dielectric layer 373c is bonded with portions of dielectric layer 361 which extend between interconnect structures 366.

Referring again to FIG. 2, method 200 further comprises (at 216) coupling a third die to the wafer via one of the first die or the second die, and via a second hybrid bond interface, wherein the respective first layer of the third die extends to the second hybrid bond interface. For example, referring now to the stage 352 shown in FIG. 3D, an encapsulation material 390 is injection molded or otherwise deposited on the top side of substrate 360—e.g., wherein encapsulation material 390 extends into a region between chiplets 370a, 370b, and/or extends into another region between chiplets 370b, 370c. In various embodiments, encapsulation material 390 surrounds one or more of chiplets 370a, 370b, 370c.

To facilitate the formation of a second tier of a multi-tier chiplet configuration, one or more interconnect structures are variously formed each at a top side of a respective first-tier chiplet. For example, referring now to the stage 353 shown in FIG. 3E, a dielectric layer 376 is deposited over each of chiplets 370a-370c and, for example, over one or more regions which are each between a respective two chiplets. In one such embodiment, dielectric layer 376 adjoins a portion of encapsulation material 390 which is disposed in the first region between chiplets 370a, 370b. Additionally or alternatively, dielectric layer 376 adjoins another portion of encapsulation material 390 which is disposed in a second region between chiplets 370b, 370c. Furthermore, a patterned mask 375 is formed on a top side of dielectric layer 376. In an embodiment, formation of patterned mask 375 includes one or more operations which, for example, are adapted from conventional lithographic techniques.

Subsequently, etch and metallization processing are performed through mask 375 to pattern holes in dielectric layer 376, and further to deposit in said holes any of various suitable metals (for example, including copper) which are to form interconnect structures at respective top sides of chiplets 370a-370c. Referring now to the stage 354 shown in FIG. 3F, the metallization processes result in the formation of interconnect structures 374a on chiplet 370a, interconnect structures 374b on chiplet 370b, and interconnect structures 374c on chiplet 370c.

At stage 355, one or more other second-tier chiplets (e.g., including the illustrative chiplets 370d, 370e shown) are each coupled to a carrier wafer 359b. In the example embodiment shown, a bottom side of chiplet 370d is formed at least in part by a dielectric layer 373d, wherein interconnect structures 374d variously extend through dielectric layer 373d to facilitate coupling with circuit structures of chiplet 370d. Additionally or alternatively, a bottom side of chiplet 370e is formed at least in part by a dielectric layer 373e, wherein interconnect structures 374e variously extend through dielectric layer 373e to facilitate coupling with circuit structures of chiplet 370e. To facilitate stress mitigation in a multi-tier chiplet configuration, a composition of dielectric layer 373d is substantially different than the composition of another dielectric layer (not shown) in chiplet 370d. Additionally or alternatively, a composition of dielectric layer 373e is substantially different than the composition of another dielectric layer (not shown) in chiplet 370e.

At stage 355, carrier wafer 359b is brought into a position over dielectric layer 376—e.g., wherein interconnect structures 374d are aligned each with a respective one of interconnect structures 374a, 374b, and wherein interconnect structures 374e are aligned each with a respective one of interconnect structures 374b, 374c. Subsequently, carrier wafer 359a is lowered to bring chiplets 370d, 370e into contact with dielectric layer 376, and hybrid bond processing is performed to bond interconnect structures 374d, 374e each with a corresponding interconnect structure in dielectric layer 376.

Figure 3H:
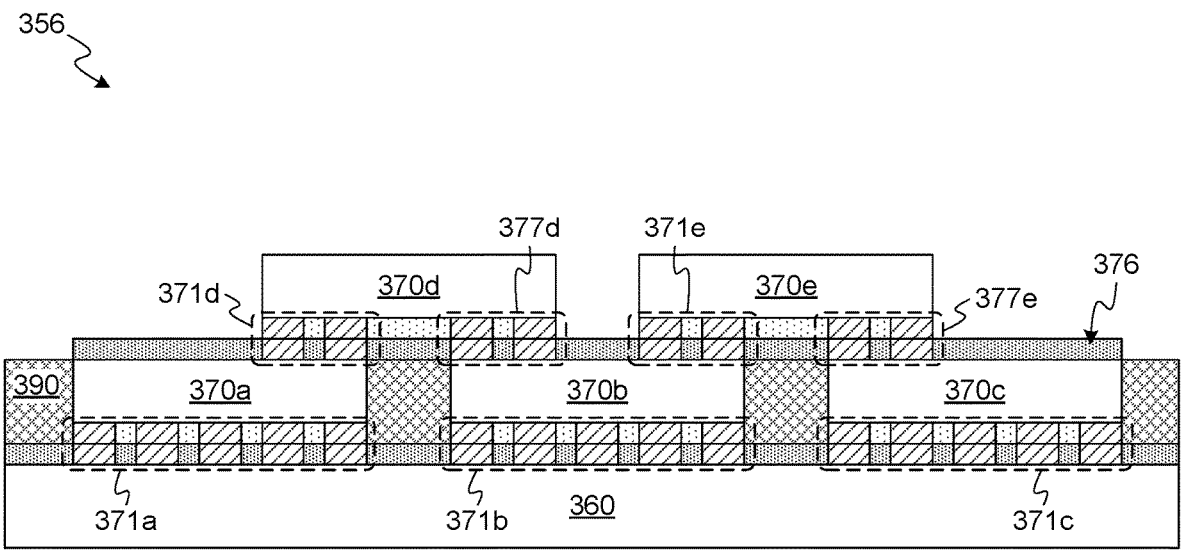

For example, referring now to the stage 356 shown in FIG. 3H, hybrid bonding results in the formation of a hybrid bond interface 371d where interconnect structures 374a are directly bonded each with a different respective one of interconnect structures 374d. Alternatively or in addition, hybrid bonding results in the formation of a hybrid bond interface 377d where some of interconnect structures 374b are directly bonded each with a different respective one of interconnect structures 374d. Alternatively or in addition, hybrid bonding results in the formation of a hybrid bond interface 371e where others of interconnect structures 374b are directly bonded each with a different respective one of interconnect structures 374e. Alternatively or in addition, hybrid bonding results in the formation of a hybrid bond interface 377e where interconnect structures 374c are directly bonded each with a different respective one of interconnect structures 374e.

In one such embodiment, processing further result in dielectric layer 373d being covalently (or otherwise) bonded with portions of dielectric layer 376 which extend between interconnect structures 374a, 374b. Alternatively or in addition, dielectric layer 373e is similarly bonded with portions of dielectric layer 376 which extend between interconnect structures 374b, 374c.

Figure 3I:
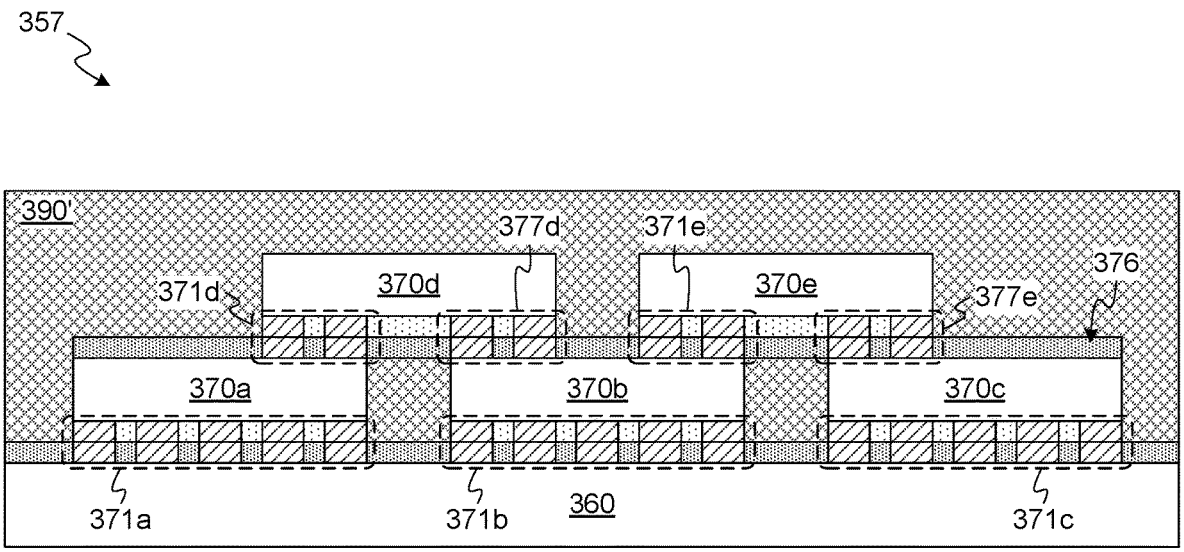

Referring now to the stage 357 shown in FIG. 3I, additional encapsulation material is injection molded or otherwise deposited on encapsulation material 390 to form an encapsulation structure 390'. In the example embodiment shown, a portion of encapsulation structure 390' extends between two or more of chiplets 370d, 370e—e.g., wherein a part of dielectric layer 376 extends over (and, for example, adjoins) a portion of encapsulation structure 390', and/or wherein another part of dielectric layer 376 extends under (and, for example, adjoins) a different portion of encapsulation structure 390'.

Figure 4:
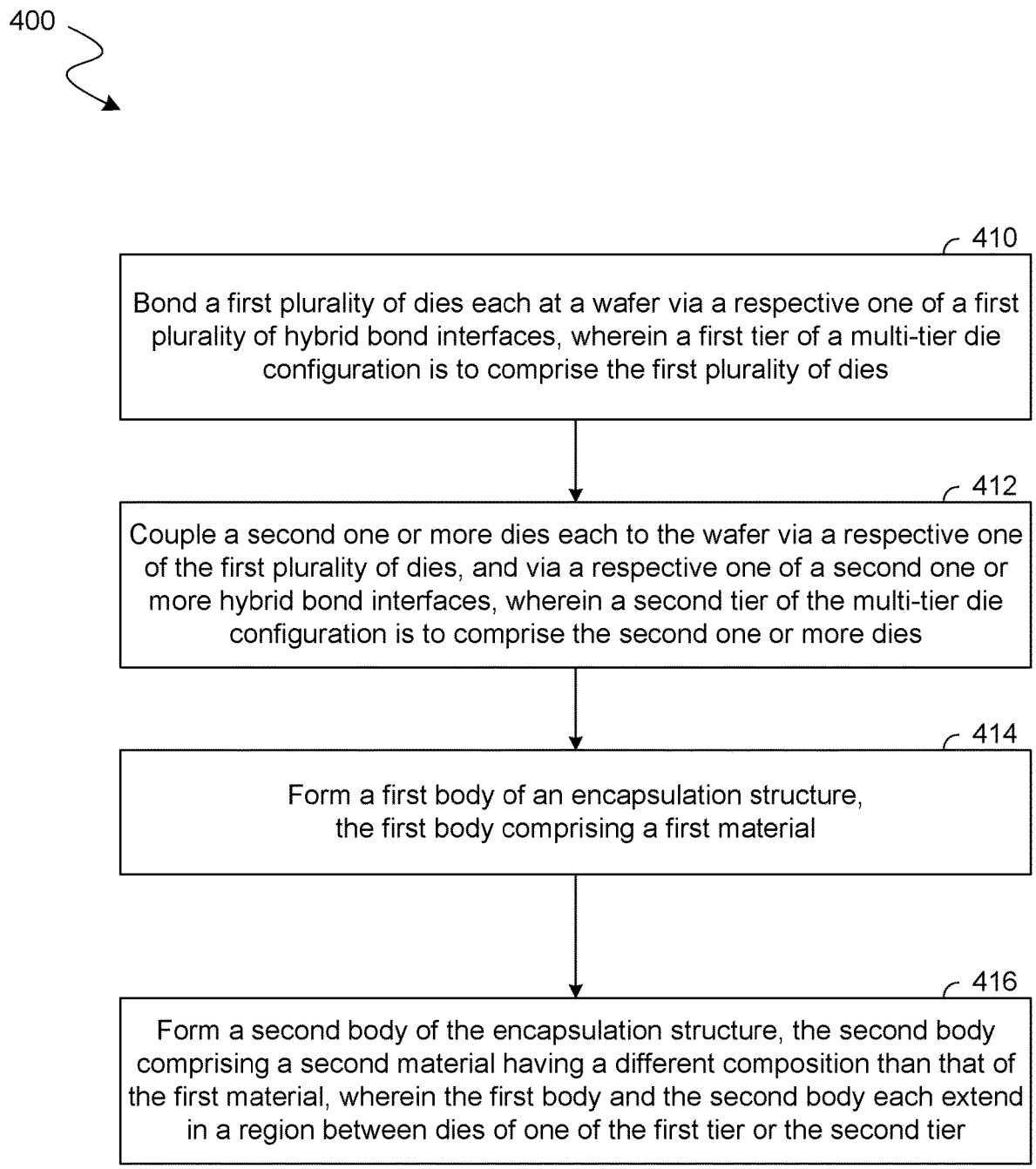
FIG. 4 shows a flow diagram illustrating features of a method to provide structures of a circuit device according to an embodiment.

FIG. 4 shows features of a method 400 to provide stress mitigation structures of a circuit device according to an embodiment. The method 400 illustrates one example of an embodiment wherein various materials in different respective portions of an encapsulation structure are provided to mitigate stress on a hybrid bond interface. Operations such as those of method 400 are performed, for example, to provide structures of packaged device 101. To illustrate certain features of various embodiments, method 400 is described herein with reference to stages 500-505 of package processing which are shown in FIGS. 5A-5F (respectively). However, in other embodiments, method 400 fabricates any of various other stress mitigation structures described herein.

As shown in FIG. 4, method 400 comprises (at 410) bonding a first plurality of dies each at a wafer via a respective one of a first plurality of hybrid bond interfaces, wherein a first tier of a multi-tier die configuration is to comprise the first plurality of dies. For example, referring now to the stage 500 shown in FIG. 5A, a substrate 510 comprises conductive contacts 512, and conductive contacts 514 which variously extend through a top side dielectric layer of substrate 510 to a surface 511. Multiple chiplets (e.g., including the illustrative chiplets 520a, 520b shown) are each coupled to a different respective region of a carrier wafer 509.

Chiplet 520a comprises conductive contacts 522a which variously extend through a bottom side dielectric layer of chiplet 520a to facilitate coupling with one or more circuit structures of chiplet 520a—e.g., wherein said circuit structures comprise one or more metallization layers, device layer structures, through silicon vias, and/or the like. Additionally or alternatively, chiplet 520b comprises conductive contacts 522b which variously extend through a bottom side dielectric layer of chiplet 520b to facilitate coupling with one or more circuit structures of chiplet 520b.

At stage 500, carrier wafer 509 is brought into a position over substrate 510—e.g., wherein conductive contacts 522a are aligned with conductive contacts 512, and wherein conductive contacts 522b are aligned with conductive contacts 514. Subsequently, carrier wafer 509 is lowered to bring chiplets 520a, 520b into contact with surface 511. Hybrid bond processing is then performed to bond conductive contacts 522a with conductive contacts 512, and to bond conductive contacts 522b with conductive contacts 514.

Figure 5A:
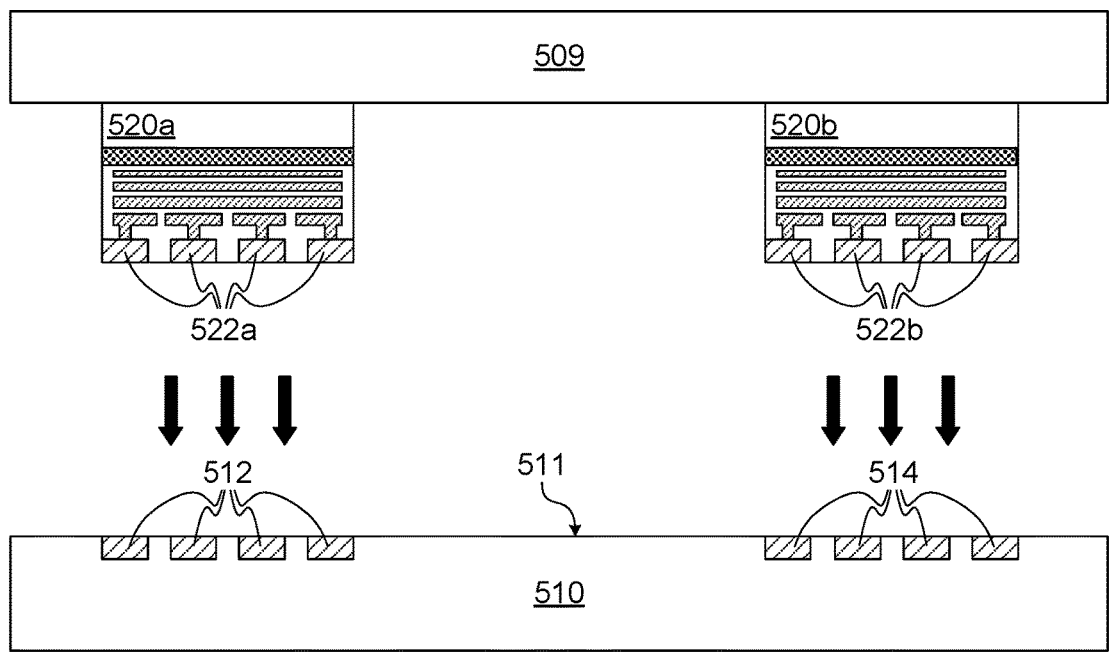
FIGS. 5A through 5F show cross-sectional side views each of a respective stage of processing to provide a circuit device according to a corresponding embodiment.
Figure 5B:
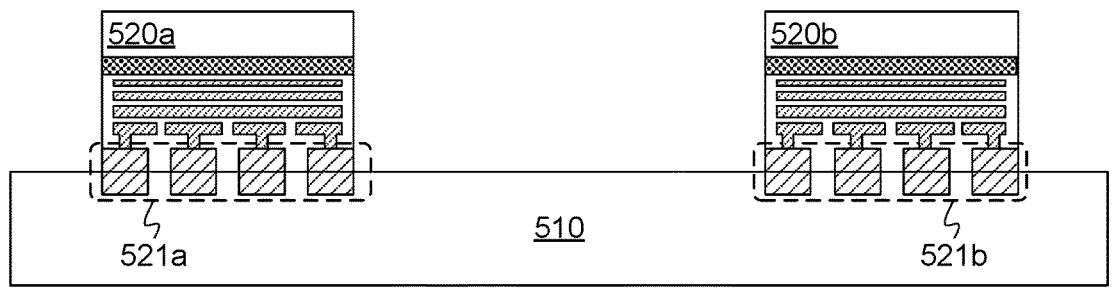
Figure 5C:
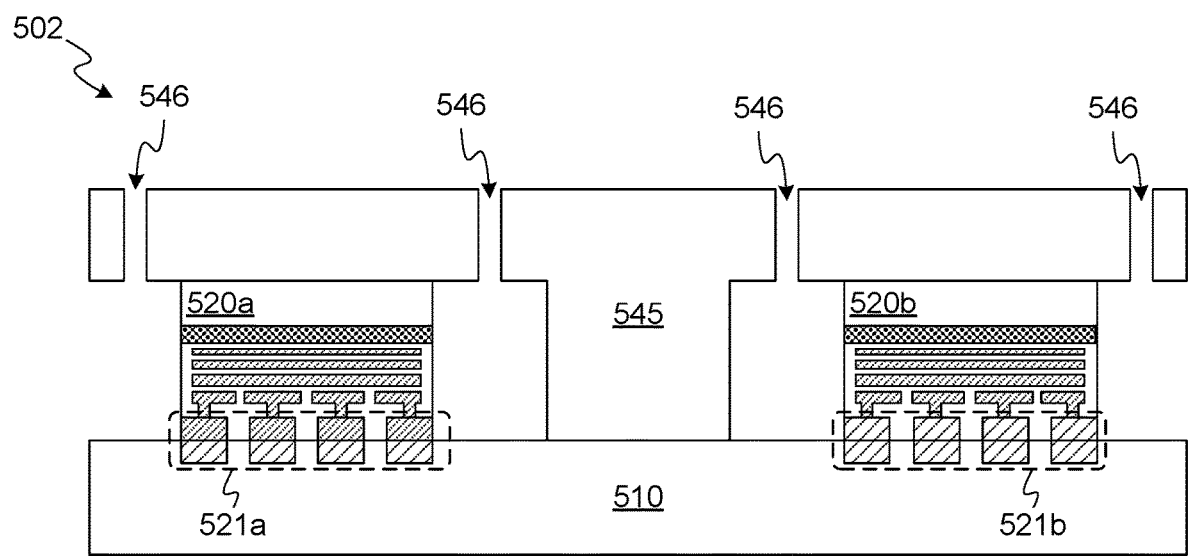

Referring now to the stage 501 shown in FIG. 5B, hybrid bonding results in the formation of a hybrid bond interface 521a where conductive contacts 512 are directly bonded each with a different respective one of conductive contacts 522a. Additionally or alternatively, a hybrid bond interface 521b is formed where conductive contacts 514 are directly bonded each with a different respective one of conductive contacts 522b. For example, chiplets 520a, 520b provide functionality of chiplets 120, 130 and hybrid bond interfaces 521a, 521b provide functionality of hybrid bond interfaces 112, 113—e.g., wherein substrate 510 corresponds functionally to substrate 110.

Method 400 comprises (at 412) coupling a second one or more dies each to the wafer via a respective one of the first plurality of dies, and via a respective one of a second one or more hybrid bond interfaces, wherein a second tier of the multi-tier die configuration is to comprise the second one or more dies.

Method 400 further comprises (at 414) forming a first body of an encapsulation structure, the first body comprising a first material. For example, referring now to the stage 502 shown in FIG. 5C, a mold structure (such as the illustrative mold chase structure 545 shown) is positioned over respective portions of substrate 510, chiplet 520a, and chiplet 520b. Mold chase structure 545 includes one or more inlets 546 which enable an injection of a mold compound onto one or more structures under mold chase structure 545. To facilitate the formation of a patterned encapsulation structure, a portion of mold chase structure 545 extends into a region between chiplets 520a, 520b.

Figure 5D:
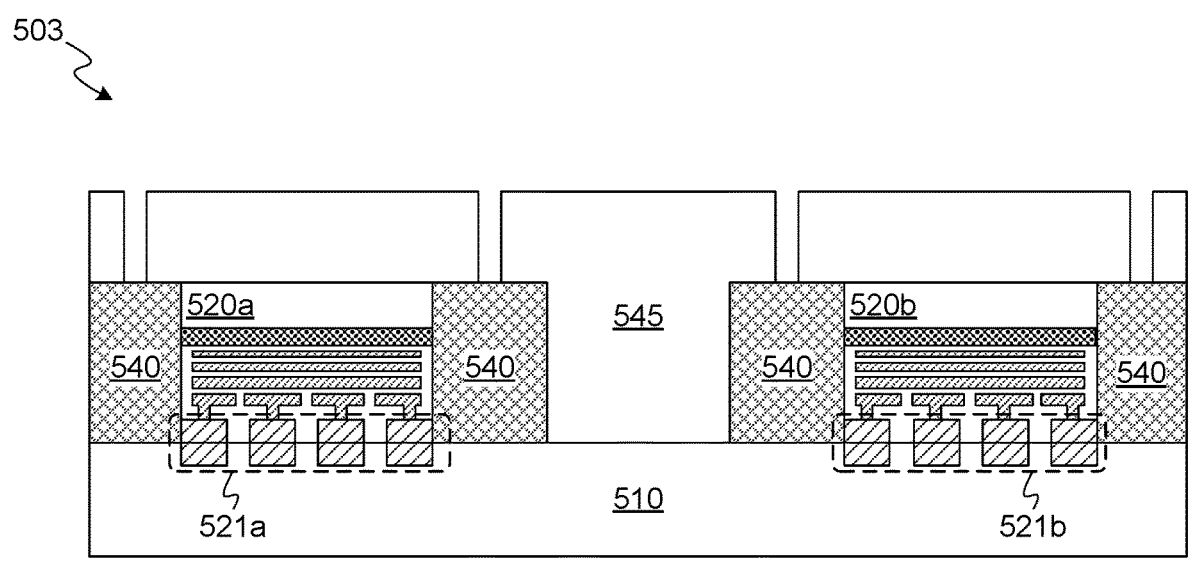

Referring now to the stage 503 shown in FIG. 5D, a first mold compound is injected or otherwise deposited through inlets 546 and onto exposed portions of surface 511—e.g., to form a body 540 comprising the first mold compound. Formation of body 540 includes one or more operations which (for example) are adapted from conventional device packaging techniques. In one embodiment, a portion of body 540 extends into a region between chiplets 520a, 520b.

Figure 5E:
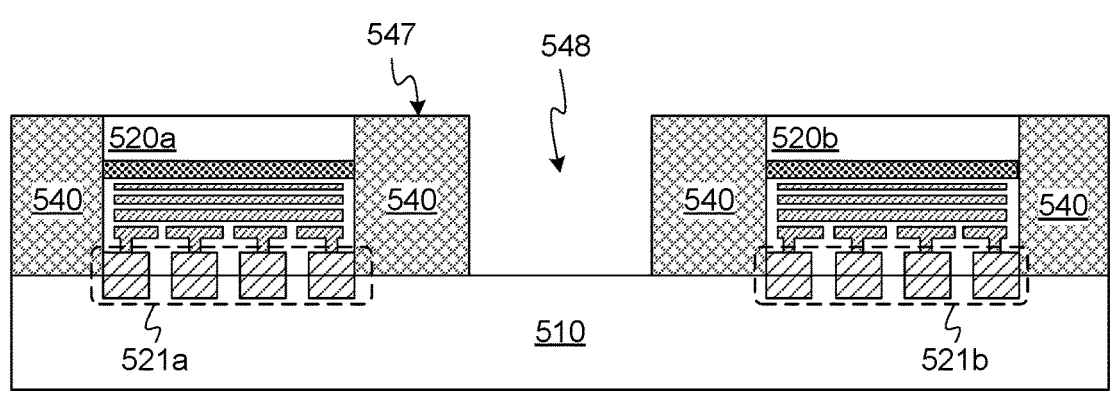

Referring now to the stage 504 shown in FIG. 5E, mold chase structure 545 is removed to expose a side 547 of body 540, and a recess structure 548 formed by body 540. For example, recess structure 548 is formed in side 547, and extends toward substrate 510 and at least partially through a region between chiplets 520a, 520b. In an alternative embodiment, recess structure 548 is formed by drilling, etching, laser ablation, and/or other subtractive processes to selectively remove portions of an encapsulation material.

Referring again to FIG. 4, method 400 further comprises (at 416) forming a second body of the encapsulation structure, the second body comprising a second material having a substantially different composition than that of the first material, wherein the first body and the second body each extend in a region between dies of one of the first tier or the second tier. In one embodiment, a coefficient of thermal expansion (CTE) of the second material is less than 5 parts per million per degree Kelvin (ppm/° K). In another embodiment, a Young's modulus of the second material is less than 100 megaPascals (MPa).

Figure 5F:
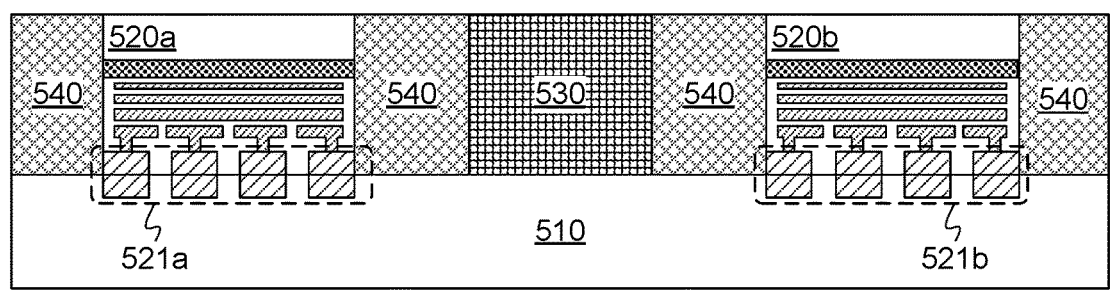

Referring now to the stage 505 shown in FIG. 5F, a second mold compound (having a composition substantially different than that of the first mold compound forming body 540) is injected or otherwise deposited into recess structure 548 to form another body 530 of the encapsulation structure. In the region between chiplets 520a, 520b, the body 540 adjoins each of two opposite sides of body 530—e.g., wherein a contiguous portion of the encapsulation structure extends across the region to each of chiplets 520a, 520b. In one such embodiment, bodies 530, 540 each comprise a respective portion in a region between chiplets 520a, 520b, wherein the respective portions each span at least 10% of a total distance between chiplets 520a, 520b.

In an illustrative scenario according to one embodiment, a first encapsulation material of body 540 comprises any of various suitable mold compounds including (for example) a plastic material, such as a thermosetting polymer or an epoxy resin or a filled epoxy resin such as a thermosetting mold compound. In one such embodiment, a second encapsulation material of body 530—as compared to the first encapsulation material—exhibits a relatively low CTE and/or a relatively low Young's modulus. By way of illustration and not limitation, a CTE for the second encapsulation material of body 530 is less than 5 parts per million per degree Kelvin (ppm/° K), in an embodiment. Additionally or alternatively, a Young's modulus for the second encapsulation material is less than 100 megaPascals (MPa), for example. In various embodiments, the second encapsulation material is a composite material comprising (for example) a resin or other suitable media, and particles of a filler material such as glass, ceramic, silica, silicon carbide, or the like.

In various embodiments, method 400 further comprises operations (not shown) which couple a third chiplet to the wafer via a respective hybrid bond interface—e.g., wherein the first tier (or alternatively, the second tier) further comprises the third chiplet. In one such embodiment, the encapsulation structure further comprises a third body of the second material—e.g., wherein the first body further extends into a second region between the second chiplet and the third chiplet, and wherein the third body also extends into the second region.

Figure 6:
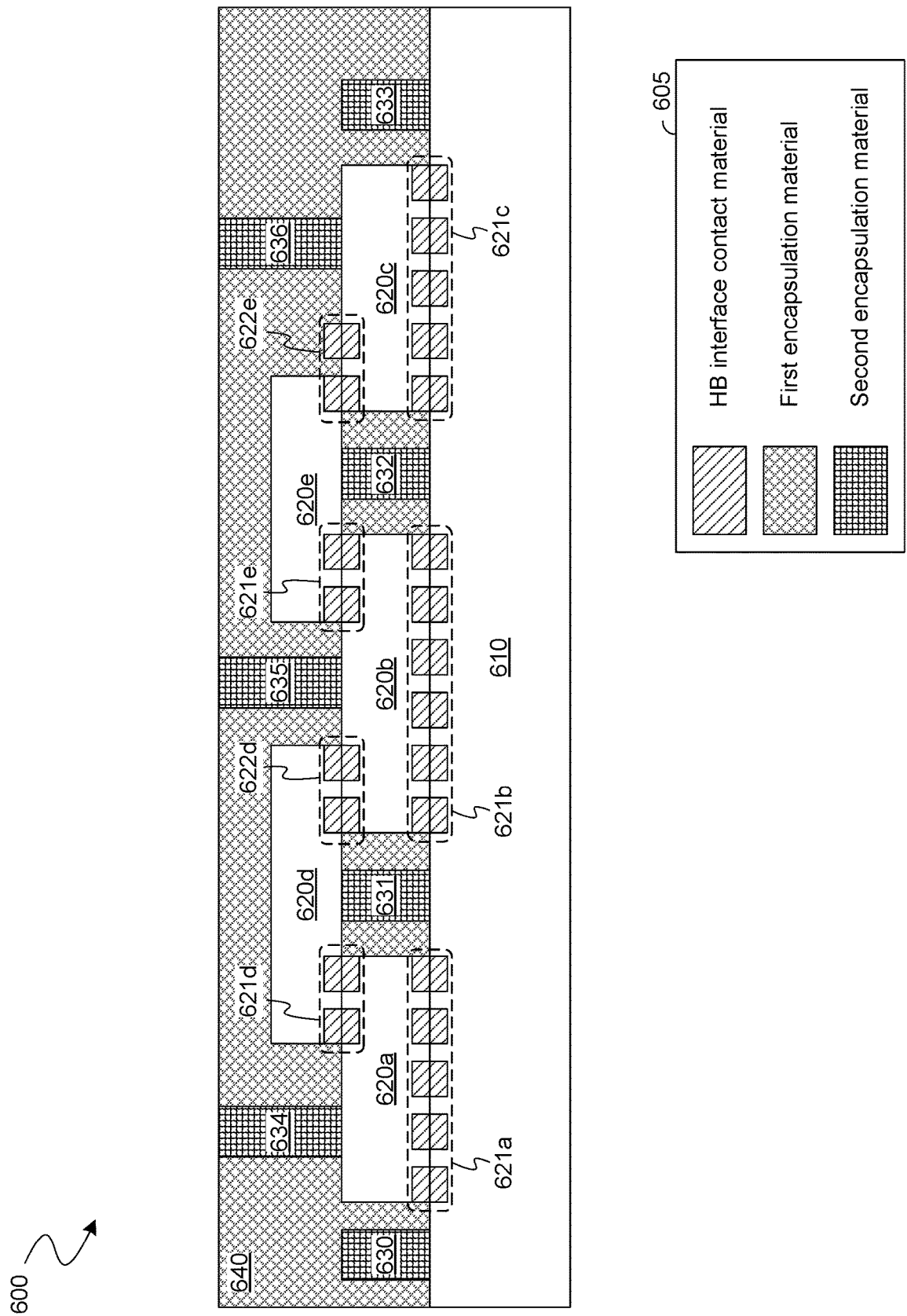
FIG. 6 shows a cross-sectional side view of a packaged device comprising structures to mitigate stress according to an embodiment.

FIG. 6 shows features of a packaged device 600 comprising structures to mitigate stresses at hybrid bond interfaces according to an embodiment. Device 600 illustrates one embodiment wherein an encapsulation structure, formed on a multi-tier chiplet configuration, comprises bodies of substantially different respective material compositions. Such different compositions facilitate stress absorption and/or stress redistribution in the multi-tier chiplet configuration. Device 600 provides functionality such as that of packaged device 101—e.g., wherein structures of device 600 are provided with one or more operations of method 400 and/or with processing such as that shown in stages 500-505.

As shown in FIG. 6, device 600 comprises a substrate 610 (e.g., a host die) and multiple chiplets—such as the illustrative chiplets 620a-620e— some or all of which are variously bonded in a multi-tier configuration on a surface of substrate 610. In the example embodiment shown, a first tier of the multi-tier chiplet configuration comprises chiplets 620a-620c—e.g., wherein hybrid bond interfaces 621a, 621b, 621c bond chiplets 620a, 620b, 620c (respectively) to substrate 610. Furthermore, a second chiplet tier, on the first chiplet tier, comprises chiplets 620d, 620e—e.g., wherein hybrid bond interfaces 621d, 622d bond chiplet 620d to chiplets 620a, 620b (respectively), and wherein hybrid bond interfaces 621e, 622e bond chiplet 620e to chiplets 620b, 620c (respectively).

For example, chiplets 620a-620c provide functionality of chiplets 120, 130 and hybrid bond interfaces 621a-621c provide functionality of hybrid bond interfaces 112, 113—e.g., wherein substrate 610, and encapsulation structure 640 correspond functionally to substrate 360, and encapsulation structure 390 (respectively). In the illustrative embodiment shown, an encapsulation structure of device 600 comprises a body 640 of a first encapsulation material, and one or more other bodies (e.g., including the illustrative bodies 630-636 shown) which are variously patterned within body 640. In an embodiment, bodies 630-636 each comprise a respective encapsulation material which has a substantially different composition than that of the first encapsulation material. The particular number, sizes and locations of bodies 630-636 in body 640 is merely illustrative, and not limiting on some embodiments.

Figure 7:
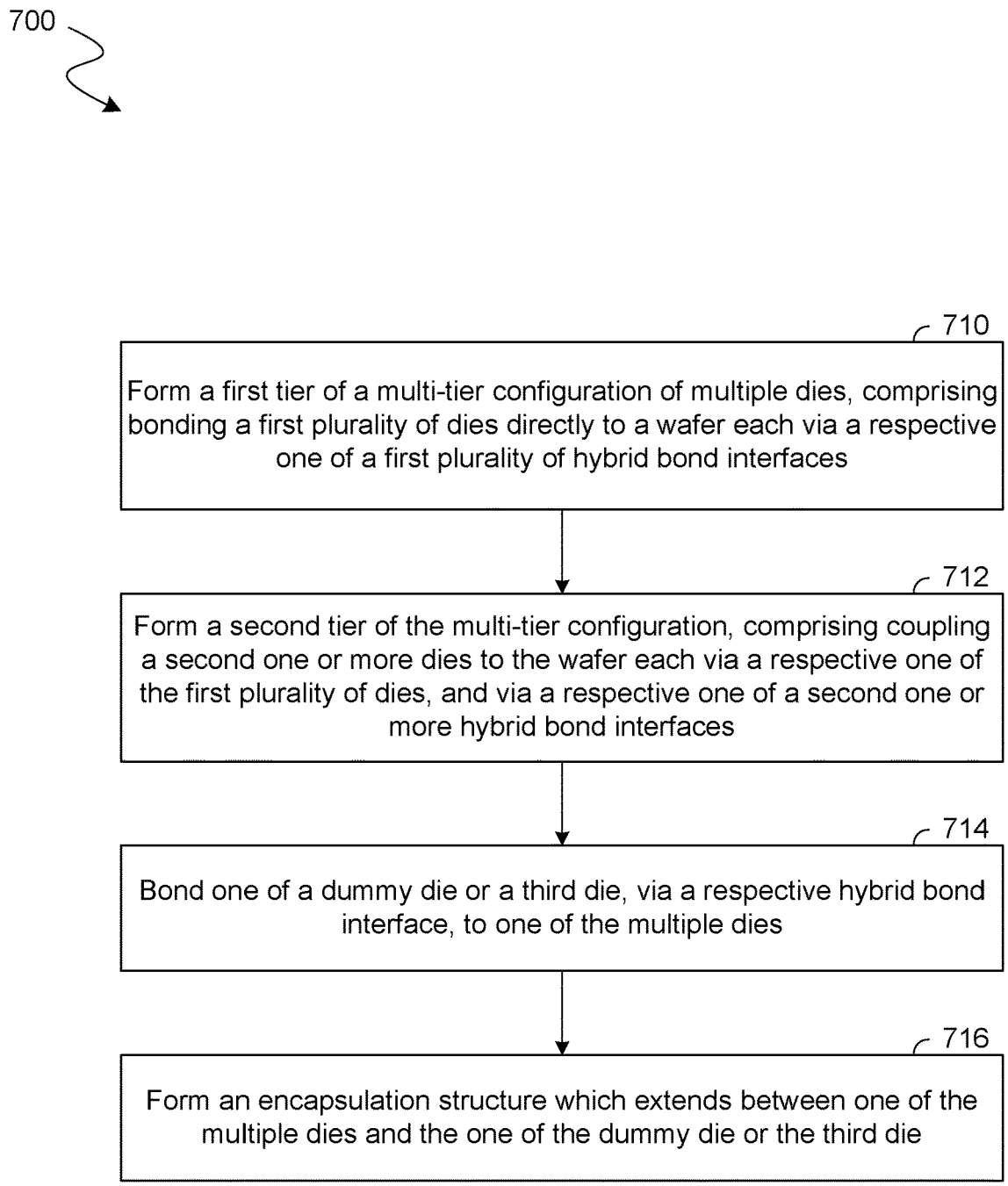
FIG. 7 shows a flow diagram illustrating features of a method to provide structures of a circuit device according to an embodiment.

FIG. 7 shows features of a method 700 to provide stress mitigation structures of a circuit device according to an embodiment. Method 700 illustrates one example of an embodiment wherein at least one of a dummy die, or a die with a substantially different type of substrate material, is bonded to one or more dies which are to be part of a multi-tier die configuration. For example, a dummy die comprises a main body portion and conductive contacts formed at a side of the main body portion. In an embodiment, the main body portion comprises a bulk material, and omits any patterned interconnect structures, circuit elements and/or other such structure which would enable communication of a signal or a voltage within the dummy die. Additionally or alternatively, stress mitigation is provided by the use of a die which has substrate that is of a substantially different (e.g., non-silicon) composition than that of the respective substrates of other dies in the multi-tier configuration.

Figure 8A:
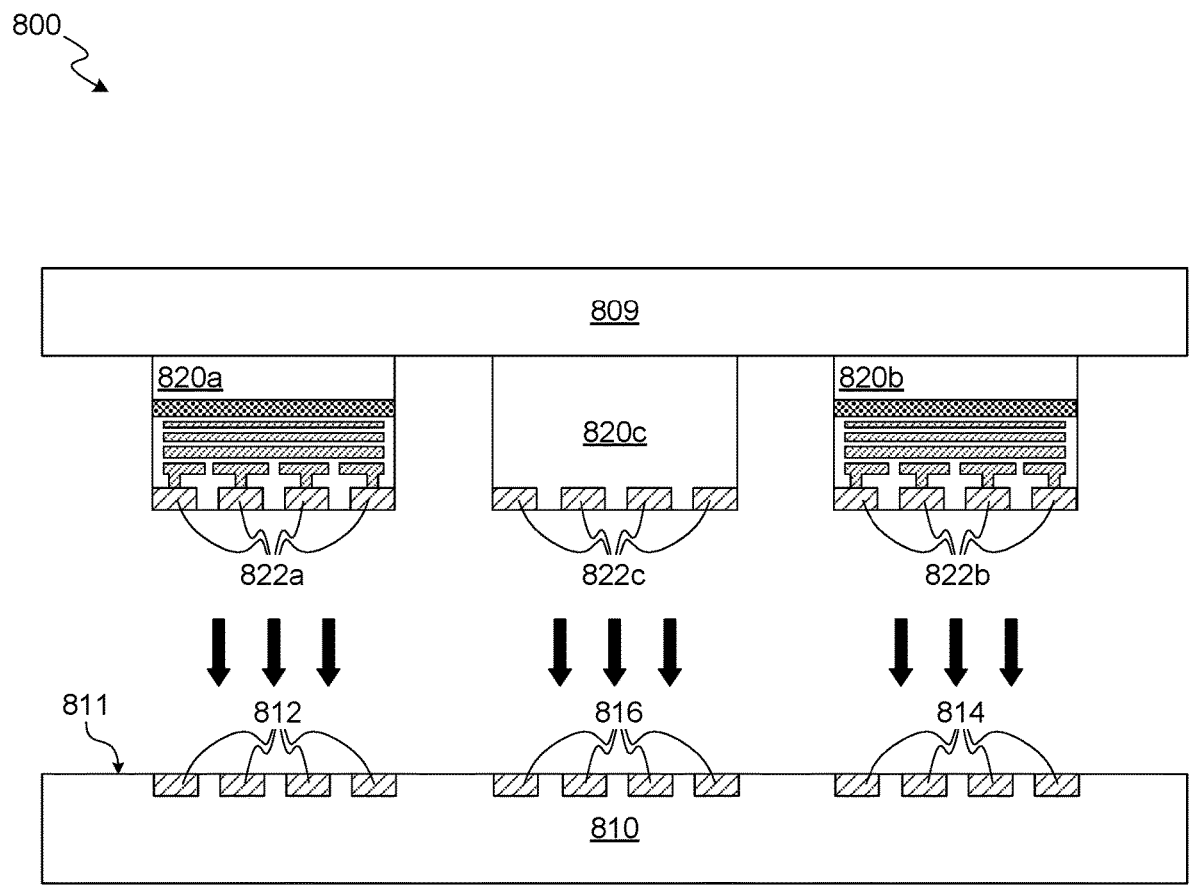
FIGS. 8A through 8C show cross-sectional side views each of a respective stage of processing to provide a circuit device according to a corresponding embodiment.
Figure 8B:
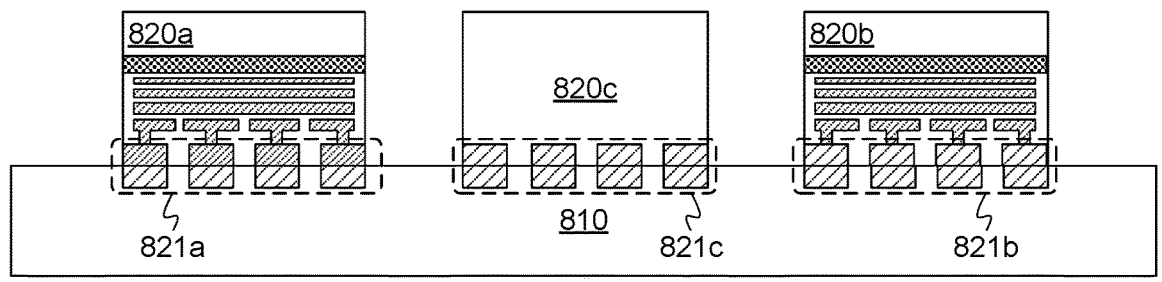
Figure 8C:
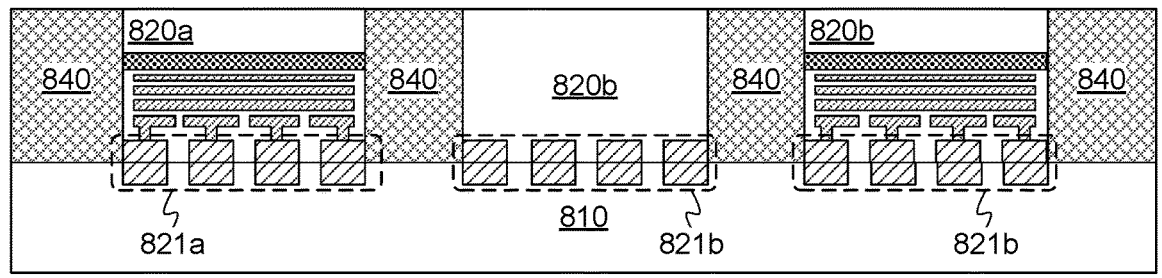

Operations such as those of method 700 are performed, for example, to provide structures of packaged device 101. To illustrate certain features of various embodiments, method 700 is described herein with reference to stages 800-802 of processing which are shown in FIGS. 8A-8C (respectively). However, in other embodiments, method 700 is to form any of various other stress mitigation structures described herein.

As shown in FIG. 7, method 700 comprises (at 710) forming a first tier of a multi-tier configuration of multiple dies. The forming at 710 comprises bonding a first plurality of dies directly to a wafer each via a respective one of a first plurality of hybrid bond interfaces. Method 700 further comprises (at 712) forming a second tier of the multi-tier configuration. In an embodiment, the forming at 710 comprises coupling a second one or more dies to the wafer each via a respective one of the first plurality of dies, and also via a respective one of a second one or more hybrid bond interfaces.

Method 700 further comprises (at 714) bonding one of a dummy die or a third die, via a respective hybrid bond interface, to one of the multiple dies. In various embodiments, the dummy die comprises a main body portion and conductive contact structures at a side of the main body portion. In one such embodiment, a coefficient of thermal expansion (CTE) of the main body portion is greater than 3 parts per million per degree Kelvin (ppm/° K). In another embodiment, the main body portion comprises a metal (e.g., copper). In still another embodiment, the main body portion comprises an organic material or—alternatively—a glass or a ceramic. Alternatively, the third die is bonded at 714, wherein the first plurality of dies and the second one or more dies each comprise a respective one of first substrates. In one such embodiment, a substrate of the third die has a substantially different material composition than the respective compositions of each of the first substrates. In one such embodiment, a CTE of the main body portion of the dummy die (or alternatively, a CTE of the third die's substrate) is substantially different than the respective CTEs of each of the first substrates.

Referring now to the stage 800 shown in FIG. 8A, a substrate 860 comprises conductive contacts 812, conductive contacts 814, and conductive contacts 816 which variously extend through a top side dielectric layer of substrate 860 to a surface 811. Multiple chiplets (e.g., including the illustrative chiplets 820a, 820b shown) and a dummy chiplet 820c are each coupled to a different respective region of a carrier wafer 809.

Chiplet 820a comprises conductive contacts 822a which variously extend through a bottom side dielectric layer of chiplet 820a to facilitate coupling with one or more circuit structures of chiplet 820a—e.g., wherein said circuit structures comprise one or more metallization layers, device layer structures, through silicon vias, and/or the like. Alternatively, chiplet 820b comprises conductive contacts 822b which variously extend through a bottom side dielectric layer of chiplet 820b to facilitate coupling with one or more circuit structures of chiplet 820b. In one such embodiment, dummy chiplet 820c comprises conductive contacts 822c which facilitate hybrid bonding with substrate 810 (for example). However, dummy chiplet 820c omits any circuit components and/or other interconnect structures which might communicate signals and/or voltages with conductive contacts 822c.

At stage 800, carrier wafer 809 is brought into a position over substrate 810—e.g., wherein conductive contacts 822a are each aligned over a respective one of conductive contacts 812, and wherein conductive contacts 822b are each aligned over a respective one of conductive contacts 814. Subsequently, carrier wafer 809 is lowered to bring chiplets 820a, 820b into contact with surface 811, and hybrid bond processing is performed to variously bond conductive contacts of substrate 810 with conductive contacts 822a, 822b, 822c.

For example, referring now to the stage 801 shown in FIG. 8B, hybrid bonding results in the formation of a hybrid bond interface 821a where conductive contacts 812 are directly bonded each with a different respective one of conductive contacts 822a. Additionally or alternatively, a hybrid bond interface 821b is formed where conductive contacts 814 are directly bonded each with a different respective one of conductive contacts 822b. Additionally or alternatively, a hybrid bond interface 821c is formed where conductive contacts 816 are directly bonded each with a different respective one of conductive contacts 822c. In one such embodiment, chiplets 820a, 820b provide functionality of chiplets 120, 130 and hybrid bond interfaces 821a, 821b provide functionality of hybrid bond interfaces 112, 113.

Referring again to FIG. 7, method 700 further comprises (at 716) forming an encapsulation structure which extends between the one of the dummy chiplet or the third chiplet, and one of the multiple chiplets. In some embodiments, the encapsulation structure extends to opposite sides of the dummy one of the chiplet or the third chiplet. For example, referring now to the stage 802 shown in FIG. 8D, an encapsulation material 840 is injection molded or otherwise deposited on the top side of substrate 810. In various embodiments, encapsulation material 840 extends in a region between chiplets 820a, and dummy chiplet 820c, and/or extends in another region between chiplets 820b, and dummy chiplet 820c. In one such embodiment, encapsulation material 840 extends to two opposite sides of (and, for example, surrounds) dummy chiplet 820b—e.g., wherein a main body portion of dummy chiplet 820b comprises a material which has a substantially different composition than that of encapsulation material 840.

In an illustrative scenario according to one embodiment, encapsulation structure 840 comprises any of various suitable mold compounds including (for example) a plastic material, such as a thermosetting polymer or an epoxy resin or a filled epoxy resin such as a thermosetting mold compound. In one such embodiment, a bulk material forming a main body portion of dummy chiplet 820b— as compared to an adjoining material of encapsulation structure 840—exhibits a relatively high CTE. By way of illustration and not limitation, a CTE for the main body portion of dummy chiplet 820b is greater than 10 ppm/° K, in an embodiment. In various embodiments, one of encapsulation structure 840 or the main body portion of dummy chiplet 820b comprises a composite material including (for example) a resin or other suitable media, and particles of a filler material such as glass, ceramic, silica, silicon carbide, or the like.

Figure 9:
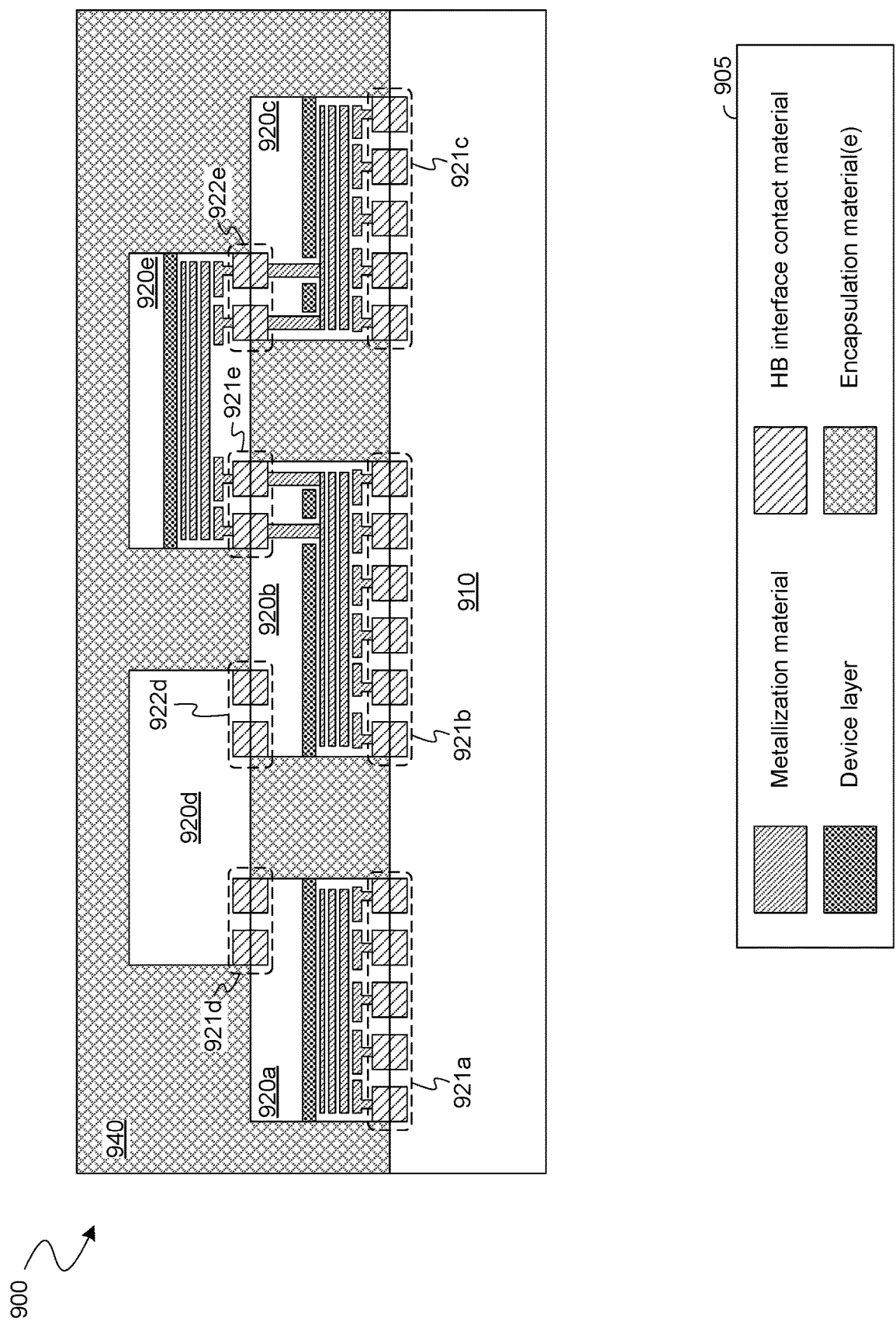
FIG. 9 shows a cross-sectional side view of a packaged device comprising structures to mitigate stress according to an embodiment.

FIG. 9 shows features of a packaged device 900 comprising structures to mitigate stress at a hybrid bond interface according to an embodiment. Device 900 provides functionality such as that of packaged device 101—e.g., wherein structures of device 900 are provided with one or more operations of method 700.

As shown in FIG. 9, device 900 comprises a substrate 910 (e.g., a host die) and multiple chiplets—such as the illustrative chiplets 920a-920c, 920e shown—which are variously bonded in a multi-tier configuration on a surface of substrate 910. In the example embodiment shown, a first tier of the multi-tier configuration comprises chiplets 920a-920c—e.g., wherein hybrid bond interfaces 921a, 921b, 921c bond chiplets 920a, 920b, 920c (respectively) to substrate 910. Furthermore, a second tier, on the first chiplet tier, comprises chiplet 920e—e.g., wherein hybrid bond interfaces 921*e*, 922*e* bond chiplet 920*e* to chiplets 920*b*, 920*c* (respectively). In one such embodiment, one or more of chiplets 920*a*-920*c* variously include features of chiplets 120, 130 and/or features of chiplets 320, 330—e.g., wherein hybrid bond interfaces 921*a*-921*c* provide functionality of hybrid bond interfaces 112, 113. Additionally or alternatively, chiplet 920*e* include features of chiplet 150—e.g., wherein hybrid bond interfaces 921*e*, 922*e* correspond functionally of hybrid bond interfaces 115*a*, 115*b*.

To mitigate stresses in various hybrid bond interfaces of the multi-tier configuration, device 900 further comprises one or more dummy chiplets (e.g., including the illustrative dummy chiplet 920*d* shown) which are coupled to substrate 910 each via a respective one or more hybrid bond interfaces. By way of illustration and not limitation, dummy chiplet 920*d* is bonded to two chiplets—e.g., wherein hybrid bond interfaces 921*d*, 922*d* coupled dummy chiplet 920*d* to chiplets 920*a*, 920*b* (respectively). In one such embodiment, dummy chiplet 920*d* further spans a region between chiplets 920*a*, 920*b*—e.g., wherein an encapsulation structure 940 extends into the region and under dummy chiplet 920*d*.

Figure 10:
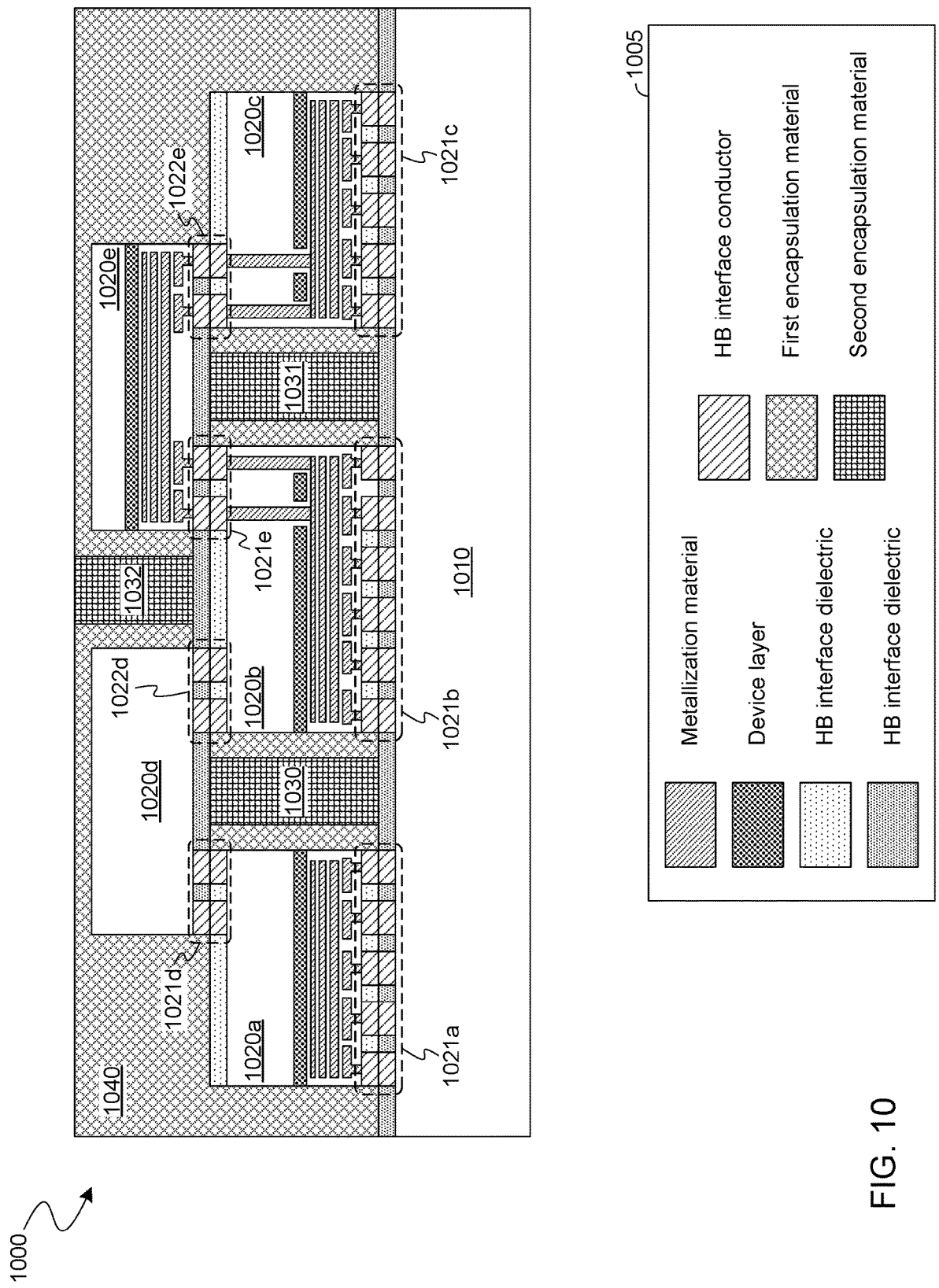
FIG. 10 shows a cross-sectional side view of a packaged device comprising structures to mitigate stress according to an embodiment.

FIG. 10 shows features of a packaged device 1000 comprising structures to mitigate stresses at different hybrid bond interfaces of a multi-tier chiplet configuration according to an embodiment. Device 1000 provides functionality such as that of packaged device 101—e.g., wherein structures of device 1000 are provided with one or more of methods 200, 400, 700. The types of various materials in device 1000 are identified in FIG. 10 by a legend 1005.

As shown in FIG. 10, device 1000 comprises a substrate 1010 (e.g., a host die) and multiple chiplets—such as the illustrative chiplets 1020*a*-1020*e*—which are variously arranged in a multi-tier configuration on substrate 1010. In the example embodiment shown, a first tier of the multi-tier configuration comprises chiplets 1020*a*-1020*c*—e.g., wherein hybrid bond interfaces 1021*a*, 1021*b*, 1021*c* bond chiplets 1020*a*, 1020*b*, 1020*c* (respectively) to substrate 1010. Furthermore, a second tier, on the first tier, comprises chiplets 1020*d*, 1020*e*—e.g., wherein hybrid bond interfaces 1021*d*, 1022*d* bond chiplet 1020*d* to chiplets 1020*a*, 1020*b* (respectively), and wherein hybrid bond interfaces 1021*e*, 1022*e* bond chiplet 1020*e* to chiplets 1020*b*, 1020*c* (respectively).

In one such embodiment, one or more of chiplets 1020*a*-1020*c* variously include features of chiplets 120, 130—e.g., wherein hybrid bond interfaces 1021*a*-1021*c* provide functionality of hybrid bond interfaces 112, 113. Furthermore, one or more of chiplets 1020*d*, 1020*e* include features of chiplet 150—e.g., wherein hybrid bond interfaces 1021*d*, 1022*d*, 1021*e*, 1022*e* provide functionality of hybrid bond interfaces 115*a*, 115*b*. The particular number, and arrangement chiplets 1020*a*-1020*e* in the multi-tier configuration is merely illustrative, and not limiting on some embodiments.

In the illustrative embodiment shown, device 1000 comprises stress mitigation structures of a type which is also provided by device 300—e.g., including stress mitigation structures provided according to method 200 and/or by processing such as that illustrated in stages 350-357. For example, an upper dielectric layer of substrate 1010 (where the upper dielectric layer extends to each of hybrid bond interfaces 1021*a*, 1021*b*, 1021*c*) has a substantially different material composition than that of another dielectric layer within substrate 1010.

In one such embodiment, for a given one of hybrid bond interfaces 1021*a*, 1021*d*, a respective dielectric layer of chiplet 1020*a*, which extends to the given hybrid bond interface, has a substantially different material composition than that of another dielectric layer within chiplet 1020*a*. Alternatively or in addition, for a given one of hybrid bond interfaces 1021*b*, 1021*e*, 1022*d*, a respective dielectric layer of chiplet 1020*b*, which extends to the given hybrid bond interface, has a substantially different material composition than that of another dielectric layer within chiplet 1020*b*. Alternatively or in addition, for a given one of hybrid bond interfaces 1021*c*, 1022*e*, a respective dielectric layer of chiplet 1020*c*, which extends to the given hybrid bond interface, has a substantially different material composition than that of another dielectric layer within chiplet 1020*c*. Alternatively or in addition, a bottom side dielectric layer of chiplet 1020*d*— which extends to hybrid bond interfaces 1021*d*, 1022*d*— has a substantially different material composition than that of another dielectric layer within chiplet 1020*d*. Alternatively or in addition, a bottom side dielectric layer of chiplet 1020*e*— which extends to hybrid bond interfaces 1021*e*, 1022*e*— has a substantially different material composition than that of another dielectric layer within chiplet 1020*e*.

In the illustrative embodiment shown, device 1000 further comprises one or more other stress mitigation structures of a type which is also provided by device 600—e.g., including stress mitigation structures provided according to method 400 and/or by processing such as that illustrated in stages 500-505. For example, an encapsulation structure of device 1000 comprises multiple bodies of various respective encapsulation materials. By way of illustration and not limitation, the encapsulation structure comprises a main body 1040 of a first encapsulation material, and one or more other bodies (e.g., including the illustrative bodies 1030, 1031, 1032 shown) which are variously patterned within the main body 1040. Some or all of bodies 1030, 1031, 1032 each comprise a respective encapsulation material which has a substantially different composition than that of the first encapsulation material. The particular number, sizes and locations of bodies 1030, 1031, 1032 in body 1040 is merely illustrative, and not limiting on some embodiments.

In some embodiments, device 1000 further comprises one or more other stress mitigation structures of a type which is also provided by device 900—e.g., including stress mitigation structures provided according to method 700 and/or by processing such as that illustrated in stages 800-802. For example, in one such embodiment, device 1000 additionally or alternatively comprises one or more dummy chiplet structures—e.g., wherein the structure represented as chiplet 1020*d* is a dummy chiplet.

Figure 11:
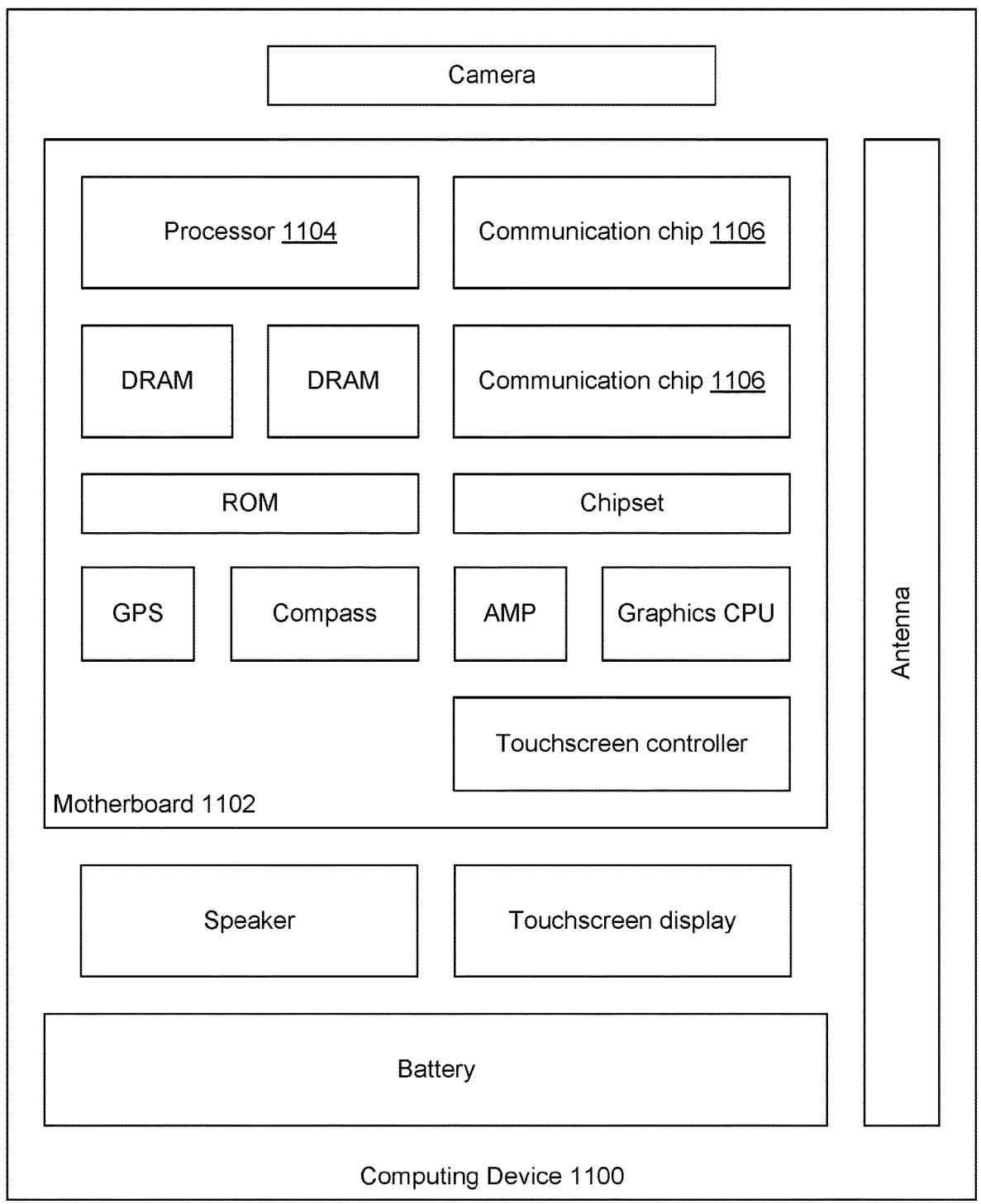
FIG. 11 is a functional block diagram illustrating a computing device in accordance with one embodiment.

FIG. 11 illustrates a computing device 1100 in accordance with one embodiment. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. The term "processor" may refer to any device or portion of a device that processes electronic data from registers and/or memory to transform that electronic data into other electronic data that may be stored in registers and/or memory. The communication chip 1106 also includes an integrated circuit die packaged within the communication chip 1106.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
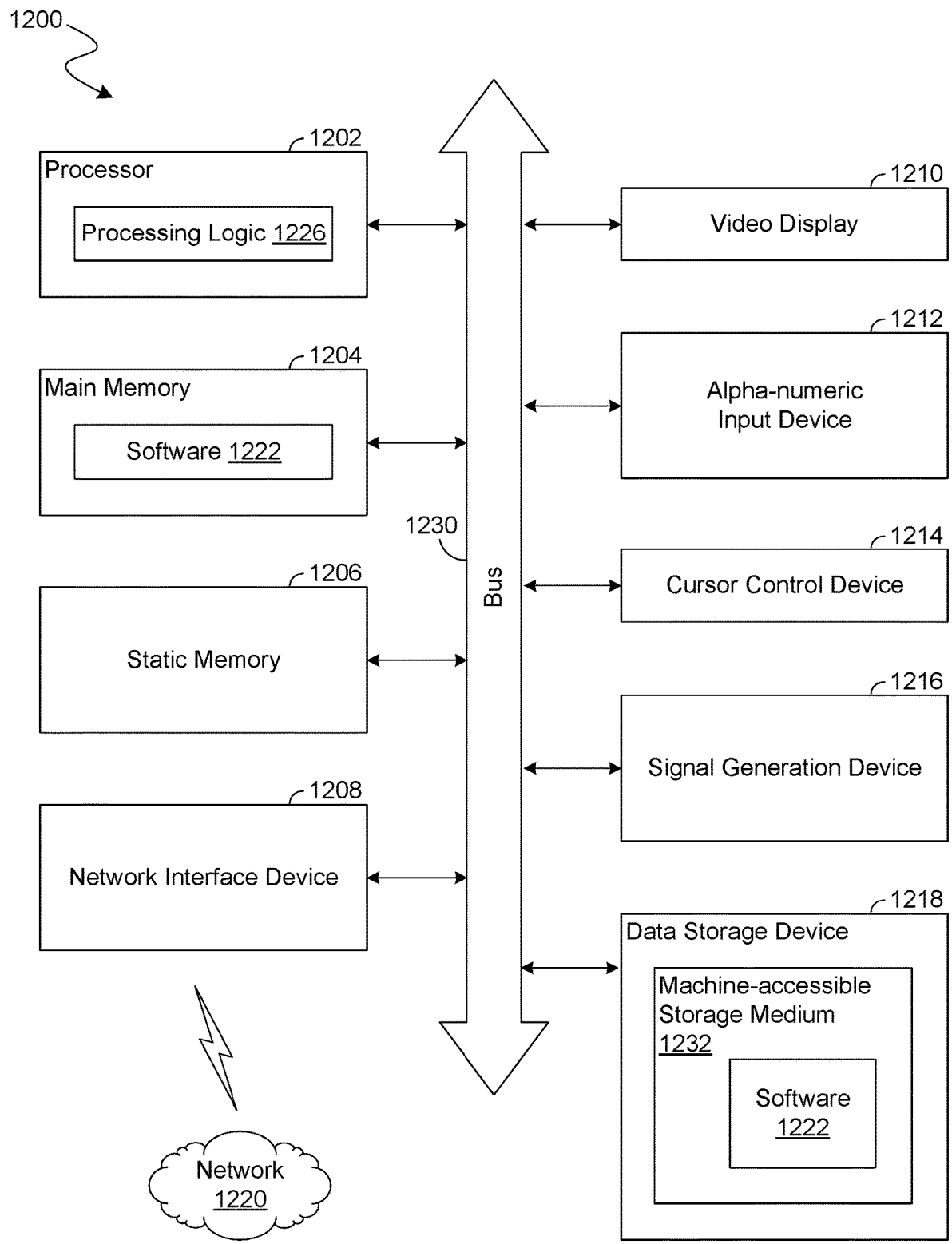
FIG. 12 is a functional block diagram illustrating an exemplary computer system, in accordance with one embodiment.

FIG. 12 illustrates a diagrammatic representation of a machine in the exemplary form of a computer system 1200 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations described herein.

The computer system 1200 may further include a network interface device 1208. The computer system 1200 also may include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1232 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one or more first embodiments, a packaged device comprises a host die, a first plurality of dies each bonded at the host die via a respective hybrid bond interface of a first plurality of hybrid bond interfaces, a second one or more dies each coupled to the host die via a respective one of the first plurality of dies, and via a respective hybrid bond interface of a second one or more hybrid bond interfaces, wherein a first tier of a multi-tier configuration of multiple dies comprises the first plurality of dies, and wherein a second tier of the multi-tier configuration comprises the second one or more dies, an encapsulation structure comprising a first body of a first material, and a second body of a second material, wherein the first material and the second material have substantially different compositions, wherein the first body and the second body each extend in a region between a first die and a second die of the multiple dies, wherein one of the first tier or the second tier comprises the first die and the second die.

In one or more second embodiments, further to the first embodiment, in the region, the first body adjoins each of two opposite sides of the second body.

In one or more third embodiments, further to the first embodiment or the second embodiment, wherein a contiguous portion of the encapsulation structure extends across the region to each of the first die and the second die.

In one or more fourth embodiments, further to the third embodiment, for each of the first body and the second body, the body spans at least a respective 10% of a total distance in the region between the first die and the second die.

In one or more fifth embodiments, further to any of the first through third embodiments, wherein the one of the first tier or the second tier further comprises a third die coupled to the host die via a respective hybrid bond interface, wherein the encapsulation structure further comprises a third body of the second material, wherein the first body further extends into a second region between the second die and the third die, and wherein the third body extends into the second region.

In one or more sixth embodiments, further to the fifth embodiment, in the second region, the first body adjoins each of two opposite sides of the third body.

In one or more seventh embodiments, further to any of the first through third embodiments, wherein the other of the first tier or the second tier comprises a third die and a fourth die each coupled to the host die via a respective hybrid bond interface, wherein the encapsulation structure further comprises a third body of the second material, wherein the first body further extends into a second region between the third die and the fourth die, and wherein the third body extends into the second region.

In one or more eighth embodiments, further to any of the first through third embodiments, wherein a coefficient of thermal expansion (CTE) of the second material is less than 5 parts per million per degree Kelvin (ppm/° K).

In one or more ninth embodiments, further to any of the first through third embodiments, wherein a Young's modulus of the second material is less than 100 megaPascals (MPa).

In one or more tenth embodiments, further to any of the first through third embodiments, wherein the region is between the third die and the host die.

In one or more eleventh embodiments, a method for providing a packaged device, the method comprises bonding a first plurality of dies each at a wafer via a respective hybrid bond interface of a first plurality of hybrid bond interfaces, coupling a second one or more dies each to the wafer via a respective one of the first plurality of dies, and via a respective hybrid bond interface of a second one or more hybrid bond interfaces, wherein a first tier of a multi-tier configuration of multiple dies comprises the first plurality of dies, and wherein a second tier of the multi-tier configuration comprises the second one or more dies, forming an encapsulation structure comprising a first body of a first material, and a second body of a second material wherein the first material and the second material have substantially different compositions, wherein the first body and the second body each extend in a region between a first die and a second die of the multiple dies, wherein one of the first tier or the second tier comprises the first die and the second die.

In one or more twelfth embodiments, further to the eleventh embodiment, in the region, the first body adjoins each of two opposite sides of the second body.

In one or more thirteenth embodiments, further to the eleventh embodiment or the twelfth embodiment, a contiguous portion of the encapsulation structure extends across the region to each of the first die and the second die.

In one or more fourteenth embodiments, further to the thirteenth embodiment, for each of the first body and the second body, the body spans at least a respective 10% of a total distance in the region between the first die and the second die.

In one or more fifteenth embodiments, further to any of the eleventh through thirteenth embodiments, the method further comprises coupling a third die to the wafer via a respective hybrid bond interface, wherein the one of the first tier or the second tier further comprises the third die, wherein the encapsulation structure further comprises a third body of the second material, wherein the first body further extends into a second region between the second die and the third die, and wherein the third body extends into the second region.

In one or more sixteenth embodiments, further to the eleventh embodiment, in the second region, the first body adjoins each of two opposite sides of the third body.

In one or more seventeenth embodiments, further to any of the eleventh through thirteenth embodiments, the method further comprises coupling a third die and a fourth die each to the wafer via a respective hybrid bond interface, wherein the other of the first tier or the second tier comprises the third die and the fourth die, wherein the encapsulation structure further comprises a third body of the second material, wherein the first body further extends into a second region between the third die and the fourth die, and wherein the third body extends into the second region.

In one or more eighteenth embodiments, further to any of the eleventh through thirteenth embodiments, a coefficient of thermal expansion (CTE) of the second material is less than 5 parts per million per degree Kelvin (ppm/° K).

In one or more nineteenth embodiments, further to any of the eleventh through thirteenth embodiments, a Young's modulus of the second material is less than 100 megaPascals (MPa).

In one or more twentieth embodiments, further to any of the eleventh through thirteenth embodiments, the region is between the third die and the host die.

In one or more twenty-first embodiments, a packaged device comprises a host die, a first plurality of dies each bonded at the host die via a respective hybrid bond interface of a first plurality of hybrid bond interfaces, a second one or more dies each coupled to the host die via a respective one of the first plurality of dies, and via a respective hybrid bond interface of a second one or more hybrid bond interfaces, wherein a first tier of a multi-tier configuration of multiple dies comprises the first plurality of dies, and wherein a second tier of the multi-tier configuration comprises the second one or more dies, one of a dummy die or a third die bonded at one of the multiple dies via a respective hybrid bond interface, wherein respective substrates of the first plurality of dies and the second one or more dies each have a respective composition which is substantially different than a composition of one of a main body portion of the dummy die, or a substrate of the third die, and an encapsulation structure which extends between one of the multiple dies, and the one of the dummy die or the third die.

In one or more twenty-second embodiments, further to the twenty-first embodiment, wherein the dummy die comprises a body and conductive contact structures at a side of the body, wherein a coefficient of thermal expansion (CTE) of the body is greater than 3 parts per million per degree Kelvin (ppm/° K).

In one or more twenty-third embodiments, further to the twenty-first embodiment or the twenty-second embodiment, wherein the dummy die comprises a body and conductive contact structures at a side of the body, wherein the body comprises a metal.

In one or more twenty-fourth embodiments, further to the twenty-third embodiment, the metal comprises copper.

In one or more twenty-fifth embodiments, further to any of the twenty-first through twenty-third embodiments, wherein the dummy die comprises a body and conductive contact structures at a side of the body, wherein the body comprises an organic material.

In one or more twenty-sixth embodiments, further to any of the twenty-first through twenty-third embodiments, wherein the dummy die comprises a body and conductive contact structures at a side of the body, wherein the body comprises a glass or a ceramic.

In one or more twenty-seventh embodiments, further to any of the twenty-first through twenty-third embodiments, wherein the dummy die is in line with the first tier over the host die.

In one or more twenty-eighth embodiments, a method for providing a packaged device, the method comprises forming on a wafer a first tier of a multi-tier configuration of multiple dies, comprising bonding a first plurality of dies directly to the wafer each via a respective hybrid bond interface of a first plurality of hybrid bond interfaces, forming on the wafer a second tier of the multi-tier configuration, comprising coupling a second one or more dies to the wafer each via a respective one of the first plurality of dies, and via a respective hybrid bond interface of a second one or more hybrid bond interfaces, bonding one of a dummy die or a third die, via a respective hybrid bond interface, to one of the multiple dies, wherein respective substrates of the first plurality of dies and the second one or more dies each have a respective composition which is substantially different than a composition of one of a main body portion of the dummy die, or a substrate of the third die, and forming an encapsulation structure which extends between one of the multiple dies, and the one of the dummy die or the third die.

In one or more twenty-ninth embodiments, further to the twenty-eighth embodiment, the dummy die comprises a body and conductive contact structures at a side of the body, wherein a coefficient of thermal expansion (CTE) of the body is greater than 3 parts per million per degree Kelvin (ppm/° K).

In one or more thirtieth embodiments, further to the twenty-eighth embodiment or the twenty-ninth embodiment, the dummy die comprises a body and conductive contact structures at a side of the body, wherein the body comprises a metal.

In one or more thirty-first embodiments, further to the thirtieth embodiment, the metal comprises copper.

In one or more thirty-second embodiments, further to any of the twenty-eighth through thirtieth embodiments, the dummy die comprises a body and conductive contact structures at a side of the body, wherein the body comprises an organic material.

In one or more thirty-third embodiments, further to any of the twenty-eighth through thirtieth embodiments, the dummy die comprises a body and conductive contact structures at a side of the body, wherein the body comprises a glass or a ceramic.

In one or more thirty-fourth embodiments, further to any of the twenty-eighth through thirtieth embodiments, the dummy die is in line with the first tier over the wafer.

In one or more thirty-fifth embodiments, a packaged device comprises a host die, a first die and a second die each bonded at the host die via a respective hybrid bond interface of a first plurality of hybrid bond interfaces, a third die coupled to the host die via one of the first die or the second die, and via a respective hybrid bond interface of a second one or more hybrid bond interfaces, wherein the host die, the third die, and one of the first die, or the second die each comprise a respective first layer of a respective first dielectric, and respective first conductive interconnect structures which extend in the respective first layer, wherein the respective first layer extends to one of the first plurality of hybrid bond interfaces, or to one of the second one or more hybrid bond interfaces, and a respective second layer of a respective second dielectric, and respective second conductive interconnect structures which extend in the respective second layer, wherein the respective first dielectric and the respective second dielectric have substantially different material compositions.

In one or more thirty-sixth embodiments, further to the thirty-fifth embodiment, for each of the host die, the third die, and the one of the first die, or the second die, the respective first layer is adjacent to the respective second layer.

In one or more thirty-seventh embodiments, further to the thirty-fifth embodiment or the thirty-sixth embodiment, for each of the host die, the third die, and the one of the first die, or the second die, a Young's modulus of the respective first dielectric is less than 25 GigaPascals (GPa).

In one or more thirty-eighth embodiments, further to any of the thirty-fifth through thirty-seventh embodiments, further comprises an encapsulation structure which extends in a region between the first die and the second die, a third layer of a third dielectric which extends over the region and to each of the second one or more hybrid bond interfaces, third conductive interconnect structures which extend in the third layer, wherein the second one or more hybrid bond interfaces comprise bonds each with a respective one of the third conductive interconnect structures.

In one or more thirty-ninth embodiments, further to any of the thirty-fifth through thirty-eighth embodiments, wherein the other of the first die, or the second die comprises a respective first layer of a respective first dielectric, and respective first conductive interconnect structures which extend in the respective first layer, wherein the respective first layer extends to one of the first plurality of hybrid bond interfaces, or to one of the second one or more hybrid bond interfaces, and a respective second layer of a respective second dielectric, and respective second conductive interconnect structures which extend in the respective second layer, wherein the respective first dielectric and the respective second dielectric have substantially different material compositions.

In one or more fortieth embodiments, further to any of the thirty-fifth through thirty-eighth embodiments, wherein the first die and the third die each extend to a hybrid bond interface of the second one or more hybrid bond interfaces.

In one or more forty-first embodiments, further to any of the thirty-fifth through thirty-eighth embodiments, wherein the first die and the second die are each in a first tier of a multi-tier configuration of multiple dies on the host die, and wherein the third die is in second second tier of the multi-tier configuration.

In one or more forty-second embodiments, a method for providing a packaged device, the method comprises directly bonding a first die and a second die each to a wafer via a respective hybrid bond interface of a first plurality of hybrid bond interfaces, coupling a third die to the wafer via one of the first die or the second die, and via a respective hybrid bond interface of a second one or more hybrid bond interfaces, wherein the wafer, the third die, and one of the first die, or the second die each comprise a respective first layer of a respective first dielectric, and respective first conductive interconnect structures which extend in the respective first layer, wherein the respective first layer extends to one of the first plurality of hybrid bond interfaces, or to one of the second one or more hybrid bond interfaces, and a respective second layer of a respective second dielectric, and respective second conductive interconnect structures which extend in the respective second layer, wherein the respective first dielectric and the respective second dielectric have substantially different material compositions.

In one or more forty-third embodiments, further to the forty-second embodiment, for each of the wafer, the third die, and the one of the first die, or the second die, the respective first layer is adjacent to the respective second layer.

In one or more forty-fourth embodiments, further to the forty-second embodiment or the forty-third embodiment, for each of the wafer, the third die, and the one of the first die, or the second die, a Young's modulus of the respective first dielectric is less than 25 GigaPascals (GPa).

In one or more forty-fifth embodiments, further to any of the forty-second through forty-fourth embodiments, the method further comprises prior to coupling the third die, forming an encapsulation structure which extends in a region between the first die and the second die, forming a third layer of a third dielectric which extends over the region and to each of the second one or more hybrid bond interfaces, and forming third conductive interconnect structures which extend in the third layer, wherein the second one or more hybrid bond interfaces comprise bonds each with a respective one of the third conductive interconnect structures.

In one or more forty-sixth embodiments, further to any of the forty-second through forty-fifth embodiments, the other of the first die, or the second die comprises a respective first layer of a respective first dielectric, and respective first conductive interconnect structures which extend in the respective first layer, wherein the respective first layer extends to one of the first plurality of hybrid bond interfaces, or to one of the second one or more hybrid bond interfaces, and a respective second layer of a respective second dielectric, and respective second conductive interconnect structures which extend in the respective second layer, wherein the respective first dielectric and the respective second dielectric have substantially different material compositions.

In one or more forty-seventh embodiments, further to any of the forty-second through forty-fifth embodiments, the first die and the third die each extend to a hybrid bond interface of the second one or more hybrid bond interfaces.

In one or more forty-eighth embodiments, further to any of the forty-second through forty-fifth embodiments, the first die and the second die are each in a first tier of a multi-tier configuration of multiple dies on the wafer, and wherein the third die is in second second tier of the multi-tier configuration.

Techniques and architectures for mitigating stress in a circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device comprising:
a host die;
a first plurality of dies each bonded at the host die via a respective hybrid bond interface of a first plurality of hybrid bond interfaces;
a second one or more dies each coupled to the host die via a respective one of the first plurality of dies, and via a respective hybrid bond interface of a second one or more hybrid bond interfaces, wherein a first tier of a multi-tier configuration of multiple dies comprises the first plurality of dies, and wherein a second tier of the multi-tier configuration comprises the second one or more dies;
an encapsulation structure comprising a first body of a first mold compound material, and a second body of a second mold compound material;
wherein:
the first mold compound material and the second mold compound material have different compositions;
the first body and the second body each extend in a region between a first die and a second die of the multiple dies;
the first tier comprises the first die and the second die; and
the first body and the second body each extend to both:
a first vertical level of the first plurality of hybrid bond interfaces; and
a second vertical level of the second one or more hybrid bond interfaces.

2. The packaged device of claim 1, wherein, in the region, the first body adjoins each of two opposite sides of the second body.

3. The packaged device of claim 1, wherein a contiguous portion of the encapsulation structure extends across the region to each of the first die and the second die.

4. The packaged device of claim 3, wherein each of the first body and the second spans at least a respective 10% of a total horizontal distance in the region between the first die and the second die.

5. The packaged device of claim 1, wherein the one of the first tier or the second tier further comprises a third die coupled to the host die via a respective hybrid bond interface;
wherein the encapsulation structure further comprises a third body of the second mold compound material;
wherein the first body further extends into a second region between the second die and the third die; and
wherein the third body extends into the second region.

6. The packaged device of claim 1, wherein the other of the first tier or the second tier comprises a third die and a fourth die each coupled to the host die via a respective hybrid bond interface;
wherein the encapsulation structure further comprises a third body of the second mold compound material;
wherein the first body further extends into a second region between the third die and the fourth die; and
wherein the third body extends into the second region.

7. The packaged device of claim 1, wherein a coefficient of thermal expansion (CTE) of the second mold compound material is less than 5 parts per million per degree Kelvin (ppm/° K).

8. The packaged device of claim 1, wherein a Young's modulus of the second mold compound material is less than 100 megaPascals (MPa).

9. The packaged device of claim 1, wherein:
the region is a first region;
the encapsulation structure further comprises a third body of the second mold compound material;
the first body and the third body each extend in a second region between a third die and a fourth die of the multiple dies;
the second tier comprises the third die and the fourth die;
the first body and the third body each extend to the second vertical level; and
the first body and the third body each span a vertical height of the second tier.

* * * * *